United States Patent
Mendel

(10) Patent No.: US 9,942,063 B2
(45) Date of Patent: *Apr. 10, 2018

(54) APPARATUS FOR IMPROVED ENCODING AND ASSOCIATED METHODS

(71) Applicant: Altera Corporation, San Jose, CA (US)

(72) Inventor: David W. Mendel, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/142,639

(22) Filed: Dec. 27, 2013

(65) Prior Publication Data

US 2014/0119486 A1    May 1, 2014

Related U.S. Application Data

(63) Continuation-in-part of application No. 13/661,313, filed on Oct. 26, 2012, now Pat. No. 9,490,836.

(51) Int. Cl.
*H04L 25/08* (2006.01)
*H03M 5/14* (2006.01)

(52) U.S. Cl.
CPC ............ *H04L 25/08* (2013.01); *H03M 5/145* (2013.01)

(58) Field of Classification Search
CPC ... H04L 25/08; H04L 25/0276; H04L 27/066; H04L 25/03057; H03M 5/145; H03M 7/4037
See application file for complete search history.

(56) References Cited

U.S. PATENT DOCUMENTS

| | | | |
|---|---|---|---|
| 4,486,739 A | 12/1984 | Franaszek et al. | |
| 4,568,983 A * | 2/1986 | Bobick | G06T 9/005 358/1.9 |
| 5,022,051 A | 6/1991 | Crandall et al. | |
| 5,446,765 A | 8/1995 | Leger | |
| 6,304,196 B1 | 10/2001 | Copeland et al. | |
| 7,035,292 B1 | 4/2006 | Giorgetta et al. | |
| 7,061,406 B1 | 6/2006 | Dally | |

(Continued)

FOREIGN PATENT DOCUMENTS

| | | |
|---|---|---|
| CN | 1267136 A | 9/2000 |
| CN | 1471320 A | 1/2004 |

(Continued)

OTHER PUBLICATIONS

*Scalable Serdes Framer Interface (SFI-S): Implementation Agreement for Interfaces beyond 40G for Physical Layer Device*, Optical Internetworking Forum, 32 pp. (Nov. 2008), available at www.oiforum.com/public/documents/OIF_SFI-S_01.0_IA.pdf.

*Serdes Framer Interface Level 5 (SFI-5): Implementation Agreement for 40Gb/s Interface for Physical Layer Devices*, Optical Internetworking Forum, 62 pp. (Jan. 2002), available at www.oiforum.com/public/documents/OIF-SFI5-01.0.pdf.

(Continued)

*Primary Examiner* — Khaled Kassim
*Assistant Examiner* — Syed S Ali

(57) ABSTRACT

An apparatus includes an encoder adapted to encode data bits for transmission via a communication link using pulse amplitude modulation (PAM). The encoder includes a logic circuit. The logic circuit is adapted to perform a logic operation on a pattern of bits and the data bits in order to reduce a run-length and/or improve the DC balance of the data bits.

7 Claims, 22 Drawing Sheets

(56) References Cited

U.S. PATENT DOCUMENTS

| | | | |
|---|---|---|---|
| 7,782,805 B1 | 8/2010 | Belhadj et al. | |
| 7,840,136 B1* | 11/2010 | Cunningham | H04Q 3/66 385/16 |
| 8,161,347 B1 | 4/2012 | Kou | |
| 8,964,925 B1* | 2/2015 | Saed | H03L 7/0807 375/294 |
| 2004/0133729 A1* | 7/2004 | Litaize | G06F 12/0813 711/1 |
| 2004/0143402 A1* | 7/2004 | Colinge | G01N 33/6818 702/19 |
| 2004/0223556 A1* | 11/2004 | Choi | H04L 27/0004 375/295 |
| 2004/0233075 A1 | 11/2004 | Park et al. | |
| 2005/0101263 A1* | 5/2005 | Kim | H03F 1/0238 455/78 |
| 2005/0134306 A1* | 6/2005 | Stojanovic | H04L 25/028 326/31 |
| 2005/0134307 A1* | 6/2005 | Stojanovic | H04L 25/028 326/31 |
| 2006/0171234 A1* | 8/2006 | Liu et al. | 365/230.03 |
| 2007/0014358 A1* | 1/2007 | Tourapis | H04N 19/56 375/240.15 |
| 2009/0034728 A1* | 2/2009 | Goergen et al. | 380/268 |
| 2009/0177948 A1 | 7/2009 | Fischer et al. | |
| 2010/0027625 A1 | 2/2010 | Wik et al. | |
| 2011/0173516 A1 | 7/2011 | Geng et al. | |
| 2012/0023059 A1 | 1/2012 | Morgan et al. | |

FOREIGN PATENT DOCUMENTS

| | | |
|---|---|---|
| CN | 101601087 A | 12/2009 |
| EP | 0097763 A2 | 2/1983 |
| EP | 0097763 A3 | 2/1983 |
| WO | 2009017800 A2 | 2/2009 |
| WO | 2009017800 A3 | 2/2009 |

OTHER PUBLICATIONS

*Interlaken Protocol Definition, A Joint Specification of Cortina Systems and Cisco Systems,* Rev. 1.2, 52 pp. (Oct. 7, 2008), available at www.interlakenalliance.com/Interlaken_Protocol_Definition_v1.2.pdf.

Sowmya S. Luckoor, *Introduction to 10 Gigabit 64b/66b (Clause 49)*, 30 pp. (Oct. 22, 2001), available at www.iol.unh.edu/services/testing/10gec/training/10GbE_C149.pdf.

Rick Walker et al., *64b/66b coding update*, 19 pp. (Mar. 6, 2000), available at www.omnisterra.com/walker/pdfs.talks/albuquerque.pdf.

David S. McCallum, *UXPi favors NRZ signaling scheme*, 4 pp. (Jul. 1, 2004), available at www.eetimes.com/document.asp?doc_id=1292776&print=yes.

U.S. Appl. No. 13/661,313, filed Oct. 2012, Mendel.

Search report in EP application No. 2725716A1, dated Feb. 3, 2014, 6 pgs.

Eric Tell et al., "A Hardware Architecture for a Multi Mode Block Interleaver," Nov. 3, 2004, 4 pgs.

Office communication in U.S. Appl. No. 13/661,313, filed Dec. 18, 2014, 45 pgs.

Office communication in U.S. Appl. No. 13/661,313, filed Sep. 11, 2015, 50 pgs.

Search report in EP application No. 14199921, Sep. 28, 2015, 9 pgs.

"DC Bias," Wikipedia, Sep. 2015, 4 pgs.

Anonymous: "8b/10b encoding", Wikipedia, Dec. 7, 2013 (Dec. 7, 2013), XP055430786, Retrieved from the Internet: URL:https://en.wikipedia.org/w/index.php?title=8b/10b_encoding&oldid=525034344 [retrieved on Nov. 30, 2017].

Anonymous: "64b/66b encoding", Wikipedia, Dec. 6, 2013 (Dec. 6, 2013), XP055430799, Retrieved from the Internet: URL:https://en.wikipedia.org/w/index.php?title=64b/66b_encoding&oldid=584819476 [retrieved on Nov. 30, 2017].

\* cited by examiner

Data: {0100010000000000000010111010101} (run-length: 14)

Input Signal: {0101010101010101010101010101010101}

Encoded Data: {000100010101010101010101011011111110} (run-length: 7)

Fig. 4A

Data: 3 2 1 0 0 3 2 1 0_2 3 0 1 0 3 0 3 3 0

Input Signal: 1 0 1 0 1 0 1 0 1 0 1 0 1 0 1 0 1 0 1

Encoded Data: 0_2 2 0_1 3 3_1 1 2 0 0 2_0 0 0 0 3_1

Fig. 4B

Input Data: {01000 10000 00000 00000 10111 01010 11} (run-length: 14)

Ordering: {1, 6, 11, 16, 21, 26, 31,
5, 10, 15, 20, 25, 30,
4, 9, 14, 19, 24, 29,
3, 8, 13, 18, 23, 28,
2, 7, 12, 17, 22, 27}

Output Data: {0100101 000010 000011 000010 1000011} (run-length: 4)

Fig. 6

Original Data: {01000100000000000000101110101011} (run-length: 14)

Input Signal: {01010101010101010101010101010101}

After XOR: {00010001010101010101010101111110} (run-length: 7)

Ordering: {1, 2, 11, 12, 21, 22, 31, 32,
9, 10, 19, 20, 29, 30,
7, 8, 17, 18, 27, 28,
5, 6, 15, 16, 25, 26,
3, 4, 13, 14, 23, 24}

Output Data: {00010110010111011011000110100110} (run-length: 3)

Fig. 12

Original Data Bits: 0011 1100 0000 0000 0000 0000 1111

Outputs of Circuit 350A-350K: x x 0 0 0 0 0 1

Fig. 18

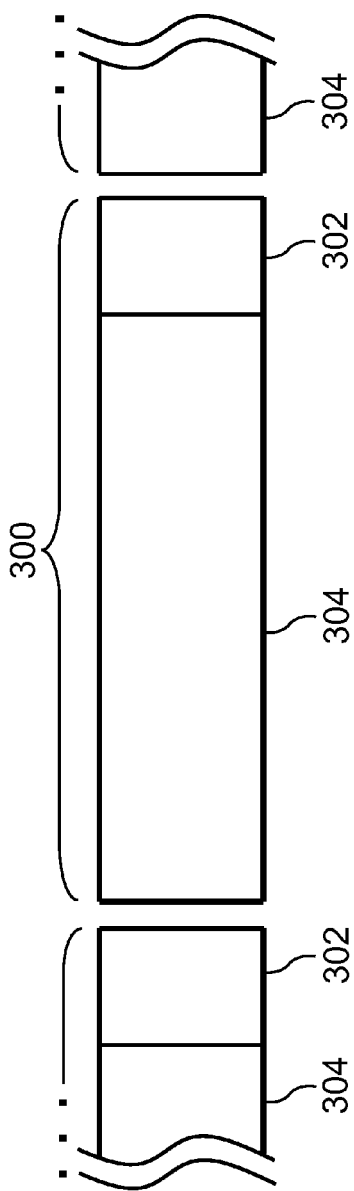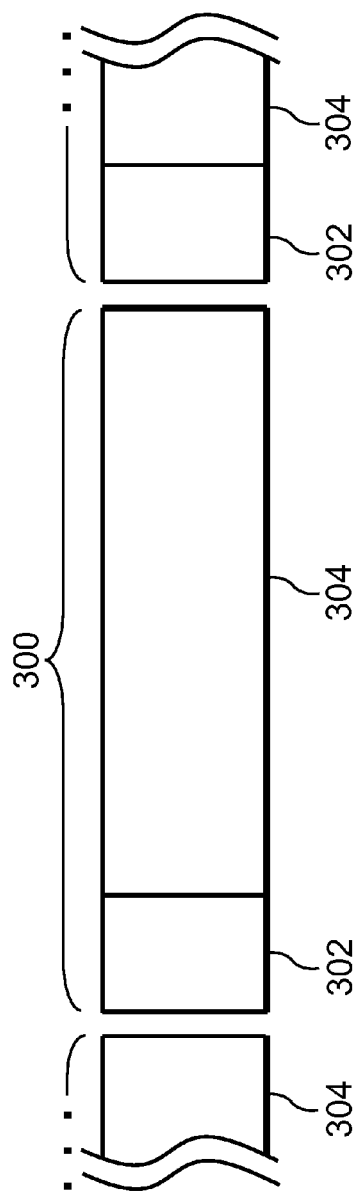

APPARATUS FOR IMPROVED ENCODING AND ASSOCIATED METHODS

CROSS-REFERENCE TO RELATED APPLICATIONS

This application is a continuation-in-part (CIP) of, and incorporates by reference in its entirety for all purposes, U.S. application Ser. No. 13/661,313, titled "Apparatus for Improved Encoding and Associated Methods," filed on Oct. 26, 2012.

TECHNICAL FIELD

The disclosed concepts relate generally to electronic communication and, more particularly, to apparatus for improved coding in electronic communication, and associated methods.

BACKGROUND

Electronic circuitry and systems sometimes use a high speed link to facilitate communication between two circuits or subsystems. The link, which might be a serial link, may communicate information or data with encoding added by a transmitter that may indicate word-boundaries, distinguish data and control information, scramble the data to spread out electromagnetic interference (EMI), avoid long run-lengths, and balance the number of zeros and ones to avoid a DC imbalance (a lack of DC balance). Examples of encoding schemes include 8b10b, 64/66, and 64/67, which are well known to persons of ordinary skill in the art. Such encoding schemes may be used with a variety of physical layer arrangements, such as pulse amplitude modulation (e.g., PAM-4 and PAM-8) schemes, known to persons of ordinary skill in the art.

At the receiver, the data communicated via the link are processed to determine word boundary, obtain lock with the transmitter, decode, etc. Once word lock is found, the data transitions are used to confirm that word-lock is maintained. The details of those operations are well known to persons of ordinary skill in the art.

SUMMARY

The disclosure relates generally to improved coding in electronic communication, apparatus with improved coding, and associated methods. A variety of apparatus and methods are contemplated. According to one exemplary embodiment, an apparatus includes an encoder adapted to encode data bits for transmission via a communication link using pulse amplitude modulation (PAM). The encoder includes a logic circuit. The logic circuit performs a logic operation on a pattern of bits and the data bits in order to reduce a run-length and/or improve the DC balance of the data bits.

According to another exemplary embodiment, an apparatus includes an encoder circuit to encode data bits for transmission as a data stream via a communication link using PAM. The encoder circuit includes a bit order scrambling circuit to scramble an order of the data bits in order to reduce a run-length and/or improve DC balance of the data stream.

According to another exemplary embodiment, an apparatus includes an encoder to encode a set of data bits, wherein the encoder encodes the data bits selectively based on a set of bits. The set of bits is used initially to establish data communication via a link using PAM.

BRIEF DESCRIPTION OF THE DRAWINGS

The appended drawings illustrate only exemplary embodiments and therefore should not be considered as limiting the scope of the application or the claims. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIGS. 4A-4B depict examples of using a logic operation according to an exemplary embodiment to reduce run-length.

FIG. 6 depicts an example of using scrambling of the bit ordering according to an exemplary embodiment to reduce run-length.

FIG. 12 illustrates an example of using scrambling of the bit ordering as well as a logic operation to reduce run-length according to an exemplary embodiment.

FIG. 15 illustrates the configuration of information bits or packets according to an exemplary embodiment.

FIG. 16 depicts the configuration of information bits or packets according to another exemplary embodiment.

FIG. 18 illustrates an example of approximating run-length according to an exemplary embodiment.

DETAILED DESCRIPTION

The disclosed concepts relate generally to improved communication in electronic circuitry or systems by improving the coding scheme used. More specifically, as described below in detail, the disclosed concepts provide apparatus and methods for a variety of data encoding schemes that provide several advantages, such as relatively low run-lengths (RL), relatively high transition density, relatively uniform transition density, relatively low overhead, and/or maintaining DC balance (or nearly or substantially maintaining DC balance). In some embodiments, the data encoding schemes may be used individually. Alternatively, in some embodiments, two or more of the encoding schemes may be combined or used together. One aspect of the disclosure relates to improving communication where PAM, such as PAM-4, PAM-8 or, generally, PAM-$2^N$, where N represents a positive integer greater than unity and $2^N$ denotes the order or number of signal levels of the PAM scheme (e.g., order 4 for PAM-4), is used at the physical layer, as described below in detail.

Run-length is a measure of a series of consecutive 0s or 1s in communicated data. Longer run-length sequences are usually more challenging for a receiver to properly detect. Shorter run-lengths allow successful communication over longer distances, for example, over a 20" backplane, rather than a 10" backplane (as might be the case with longer run-lengths). As a result of shorter run-lengths, high speed links work better over challenging connections, such as a backplane. Running disparity (RD) is a measure of the imbalance between 0s and 1s. For example, a transmission that includes 450 0s and 550 1s has a running disparity of +100, and an imbalance of (100/1000)×100%, or 10%.

Related to running disparity is DC balance (or the related concept of DC imbalance), which refers to the DC voltage that develops on the link because of running disparity. Generally, DC balance refers to encoding of the stream of data so that the running disparity of the data communicated is minimized or eliminated. In a perfectly balanced link, i.e., a link with a running disparity of zero (perfect balance between transmitted 0s and 1s), the DC balance should be the common mode voltage, the average voltage of the various states. In an imbalanced link, however, an average DC bias voltage develops on the link, i.e., the link has DC imbalance, the converse of DC balance. Thus, DC balance and DC imbalance are related concepts, as persons of ordinary skill in the art understand.

Figure 1A:
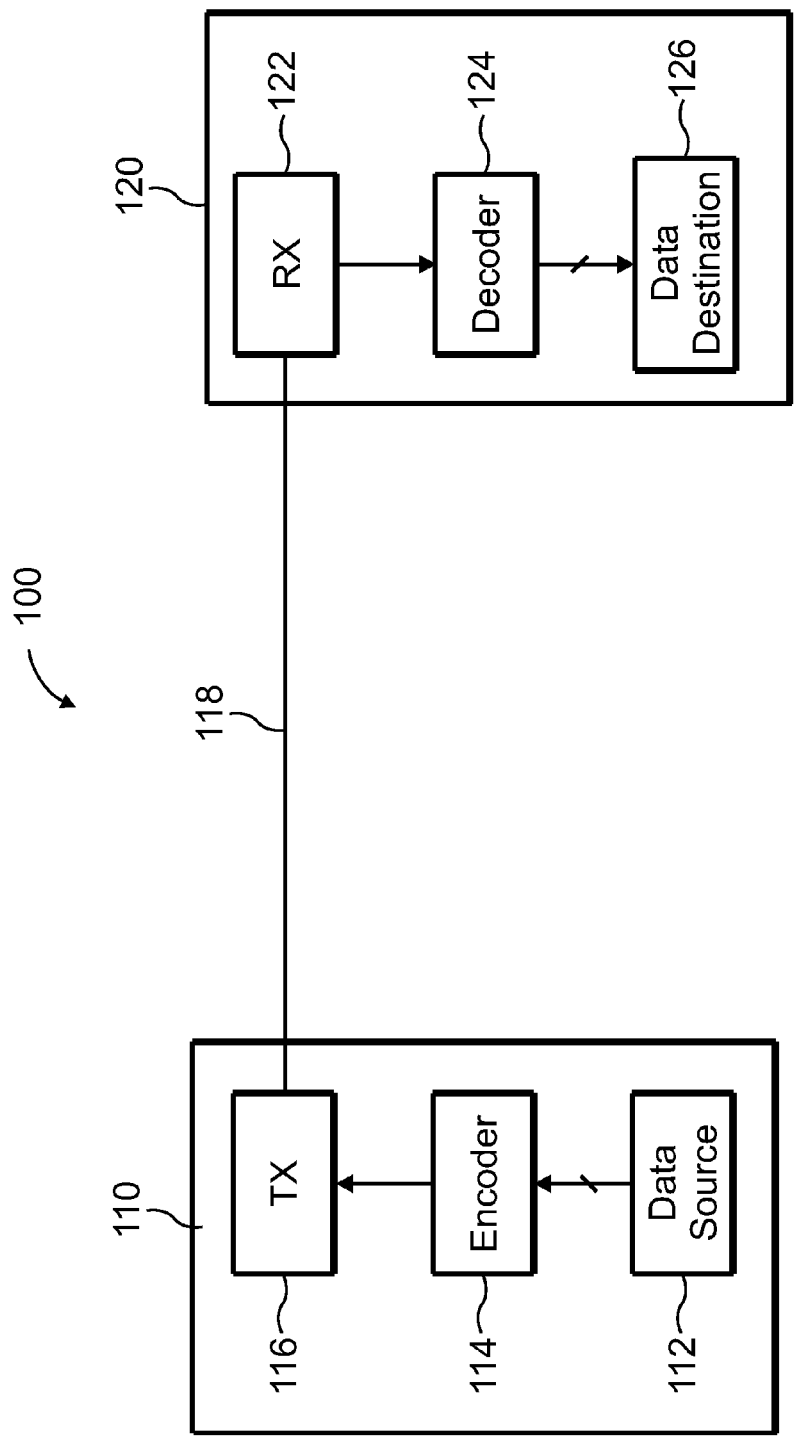
FIGS. 1A-1B illustrate block diagrams of data communication systems according to exemplary embodiments.

The disclosed encoding schemes may be used in a variety of data communication circuitry and systems. FIG. 1A illustrates a data communication system 100 according to an exemplary embodiment.

System 100 includes a data transmitter 110 coupled to a data receiver 120 via link 118. In some exemplary embodiments, data transmitter 110 may reside in the same physical enclosure or package as data receiver 120. As one example, data transmitter 110 and data receiver 120 may reside within a rack-mounted system or instrument. As another example, data transmitter 110 and data receiver 120 may reside on separate dies (or the same die) within a multi-chip module (MCM). As yet another example, data transmitter 110 and data receiver 120 may reside on or within the same die within an integrated circuit (IC). As an additional example, data transmitter 110 and data receiver 120 may reside on or within a three-dimensional (3D) package or assembly that includes one or more die, a package substrate, etc. Other variations and configurations are possible, as persons of ordinary skill in the art understand.

In some exemplary embodiments, data transmitter 110 may reside in a different physical enclosure or package than data receiver 120. As an example, data transmitter 110 may reside in a different physical enclosure or package that couples via a backplane to a physical enclosure or package that houses or includes data receiver 120. As another example, data transmitter 110 may reside in a different physical enclosure or package that couples via a cable, optical fiber, or other mechanism to a physical enclosure or package that houses or includes data receiver 120.

Encoder 114 receives data from a data source 112, and encodes the data. The encoding, described below in detail, provides some or all of the advantages mentioned above. Encoder 114 provides encoded data to transmitter circuit 116. Transmitter circuit 116 communicates the encoded data to data receiver 120 via link 118.

Data receiver 120 receives the encoded data from link 118 via receiver circuit 122. Receiver circuit 122 provides the coded data to decoder 124. Decoder 124 decodes the data, and provides the decoded data to data destination 126. Data destination 126 may include circuitry or a subsystem that ultimately (or as an intermediate destination) receives and/or uses the decoded data.

Link 118 may have a variety of forms. Generally, link 118 includes one or more coupling mechanisms, such as wires, cables, printed-circuit board (PCB) traces, optical fiber(s), conductors or semiconductors in ICs, MCMs, 3-dimensional (3D) packages and/or assemblies, and the like, to facilitate the communication of data, status, and/or control signals. In exemplary embodiments, data transmitter 110 uses serial communication to provide the encoded data to data receiver 120. As persons of ordinary skill in the art would understand, however, one may use other communication protocols, or schemes, as desired. For example, in some embodiments, the communication may occur between ICs, between subsystems, and/or between systems. The ICs, subsystems, and systems may include electrical circuitry, optical devices or circuitry, or a combination, as desired.

Figure 1B:
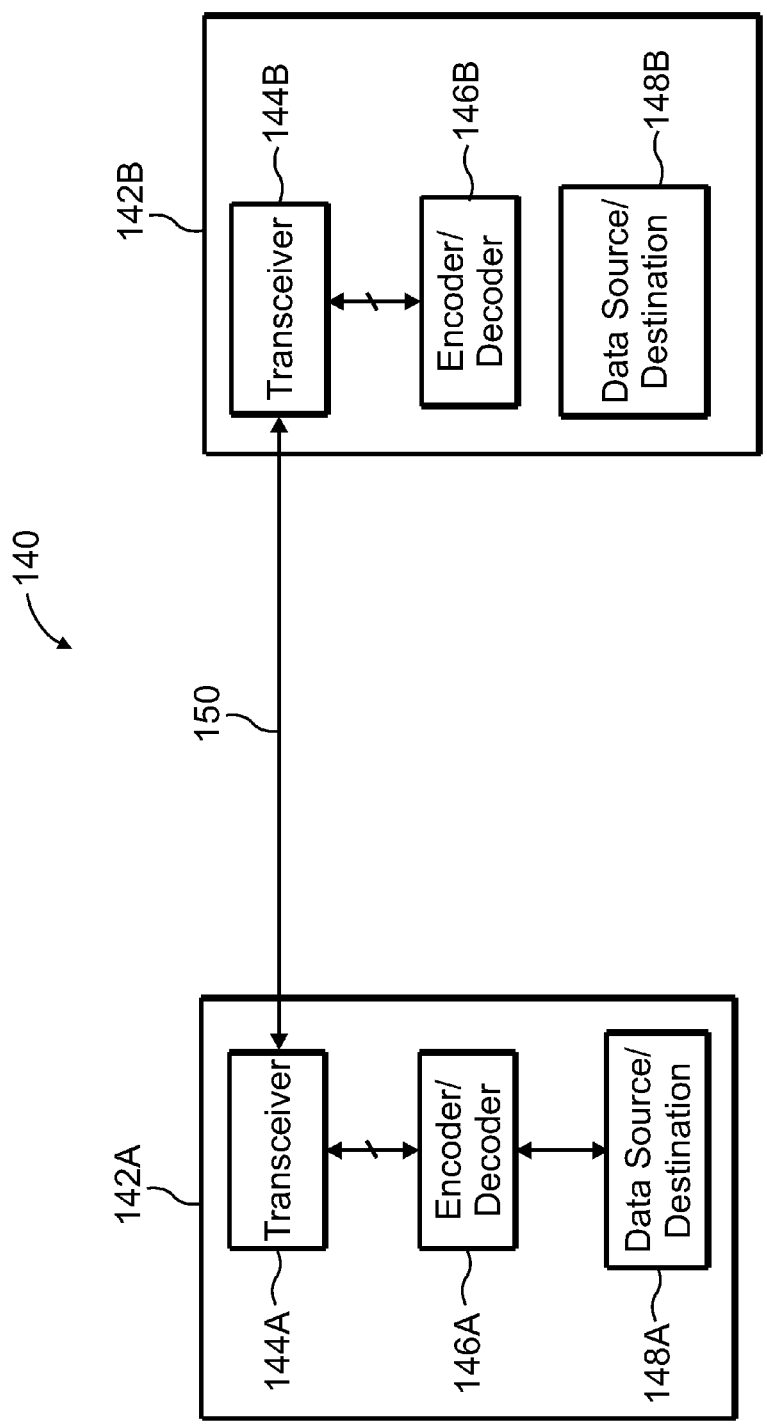

FIG. 1B illustrates a data communication system 140 according to an exemplary embodiment. In this embodiment, a pair of data transceivers 142A-142B take advantage of the encoding schemes (and the corresponding decoding schemes) for improved performance. In other words, unlike the unidirectional system 100 in FIG. 1A, system 140 provides a bidirectional communication link between data transceivers 142A-142B.

Referring to FIG. 1B, system 140 includes data transceiver 142A coupled to data transceiver 142B via link 150. In some exemplary embodiments, data transceiver 142A may reside in the same physical enclosure or package as data transceiver 142B. As one example, data transceiver 142A and data transceiver 142B may reside within a rack-mounted system or instrument. As another example, data transceiver 142A and data transceiver 142B may reside on separate die (or the same die) within an MCM, 3D package or assembly, etc., as desired. As yet another example, data transceiver 142A and data transceiver 142B may reside on or within the same die or IC.

In some exemplary embodiments, data transceiver 142A may reside in a different physical enclosure or package than data transceiver 142B. As an example, data transceiver 142A may reside in a different physical enclosure or package that couples via a backplane to a physical enclosure or package that houses or includes data transceiver 142B. As another example, data transceiver 142A may reside in a different physical enclosure or package that couples via a cable, optical fiber, or other mechanism to a physical enclosure or package that houses or includes data transceiver 142B.

As noted, communication between data transceivers 142A-142B may occur in two directions, from data transceiver 142A to data transceiver 142B, or vice-versa. Considering the first scenario, encoder/decoder 146A receives data from a data source/destination 148A, and encodes the data (for ultimate transmission to data transceiver 142B). Note that the encoding may be performed by encoding circuitry within encoder/decoder 146A, which may be similar to encoder 114 (see FIG. 1A). The encoding, described below in detail, provides some or all of the advantages mentioned above. Encoder/decoder 146A provides encoded data to transceiver circuit 144A. Transceiver circuit 144A communicates the encoded data to data transceiver 142B via link 150.

Data transceiver 142B receives the encoded data from link 150 via transceiver circuit 144B. Transceiver circuit 144B provides the coded data to encoder/decoder 146B. Encoder/decoder 146B decodes the data, and provides the decoded data to data source/destination 148B. Note that the decoding may be performed by decoding circuitry within encoder/decoder 146B, which may be similar to decoder 124 (see FIG. 1A). Data source/destination 148B may include circuitry or a subsystem that ultimately (or as an intermediate destination) receives and/or uses the decoded data.

In the second scenario, information flows from data transceiver 142B to data transceiver 142A. Encoder/decoder 146B receives data from a data source/destination 148B, and encodes the data (for ultimate transmission to data transceiver 142A). The encoding, described below in detail, provides some or all of the advantages mentioned above. Note that the encoding may be performed by encoding circuitry within encoder/decoder 146B, which may be similar to encoder 114 (see FIG. 1A). Encoder/decoder 146B provides encoded data to transceiver circuit 144B. Transceiver circuit 144B communicates the encoded data to data transceiver 142A via link 150.

Data transceiver 142A receives the encoded data from link 150 via transceiver circuit 144A. Transceiver circuit 144A provides the coded data to encoder/decoder 146A. Encoder/decoder 146A decodes the data, and provides the decoded data to data source/destination 148A. Note that the decoding may be performed by decoding circuitry within encoder/decoder 146A, which may be similar to decoder 124 (see FIG. 1A). Data source/destination 148A may include circuitry or a subsystem that ultimately (or as an intermediate destination) receives and/or uses the decoded data.

Link 150 may have a variety of forms. Generally, link 150 includes one or more coupling mechanisms, such as wires, cables, printed-circuit board (PCB) traces, conductors or semiconductors in ICs, MCMs, 3D packages or assemblies, and the like, to facilitate the communication of data and status or control signals. In exemplary embodiments, data transceiver 142A uses serial communication to provide the encoded data to data transceiver 142B, or vice-versa. As persons of ordinary skill in the art would understand, however, one may use other communication protocols, or schemes, as desired.

In exemplary embodiments, other operations may take place, such as finding word boundaries, establishing lock or synchronization between data transmitters (or transceivers) and data receivers (or transceivers), and the like. Details of those operations and their respective implementations are known to persons of ordinary skill in the art. Furthermore, the transmitter (or transmitting transceiver) and the receiver (or receiving transceiver) may auto-negotiate some parameters for an improved or better communication link, e.g., a running disparity offset other than zero, or the bias between running disparity and run-length, etc.

As noted, one aspect of the disclosure relates to improving communication where PAM, such as PAM-4, PAM-8 or, generally, PAM-$2^N$, where N represents a positive integer greater than unity. In the case of PAM, in some implementations of receivers/transceivers, the rise or fall times may depend on specific transitions in the data.

Figure 2A:
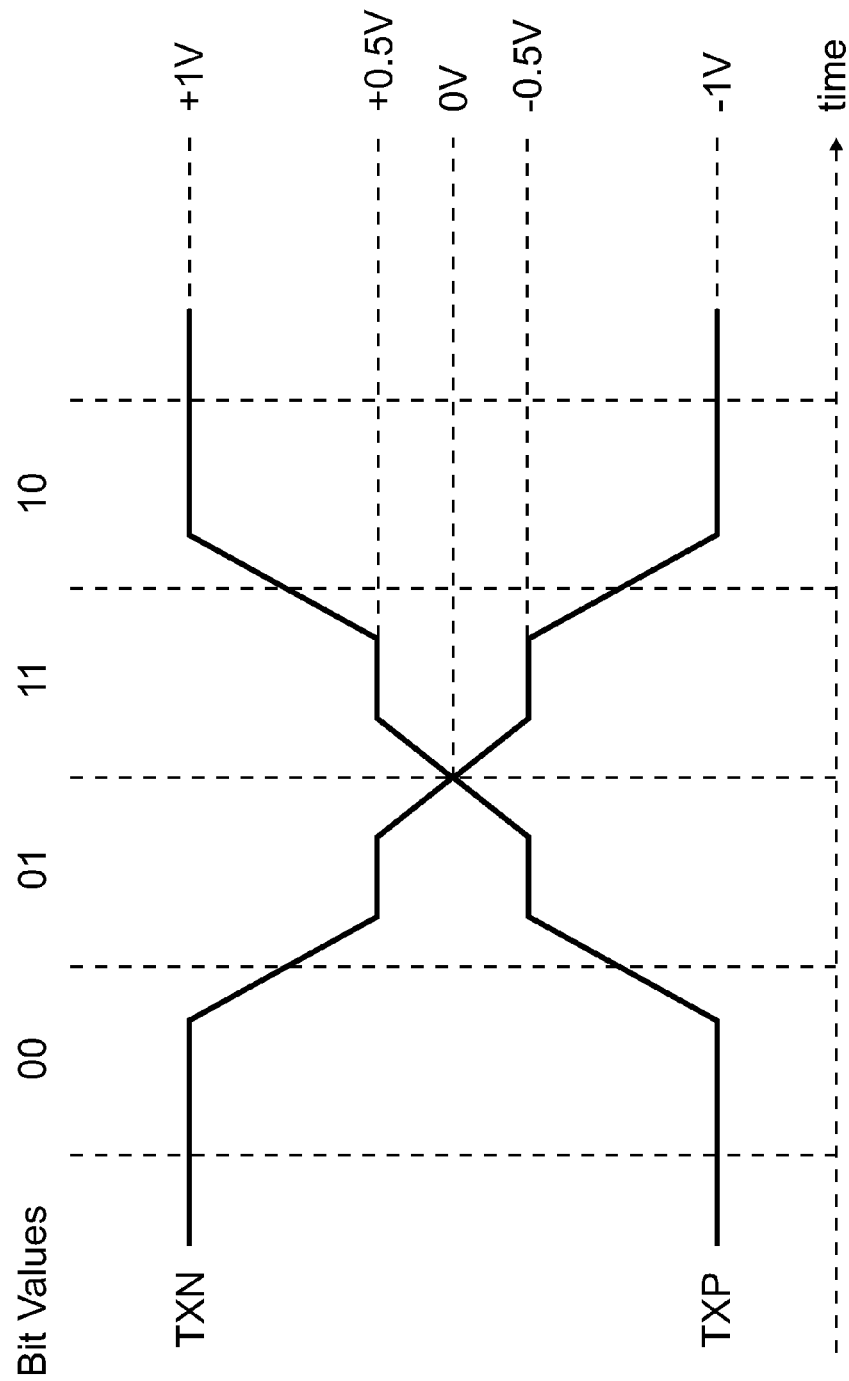
FIGS. 2A-2D depict various signals and circuits in a PAM data communication system for use in exemplary embodiments.

FIG. 2A (not drawn to scale) shows waveforms illustrating signal transitions in a PAM-4 system. The example PAM-4 system uses differential signaling. Thus, "TXN" and "TXP" refer, respectively, to the positive and negative signals that the transmitter sends to the receiver via a link. The PAM-4 system uses two bits per symbol. In other words, the symbol rate equals half of the bit rate (or clock frequency or rate).

In the example shown, the PAM system uses four voltage levels. The voltage levels constitute −1V, −0.5V, +0.5V, and +1V. In other words, the symbol values depend on the voltage levels (−1V, −0.5V, +0.5V, and +1V) of signals TXN and TXP. In the example of FIG. 2A, $V_{TXN}$=+1V and $V_{TXP}$=−1V represents 00; $V_{TXN}$=+0.5V and $V_{TXP}$=−0.5V represents 01; and so forth, where $V_{TXN}$ and $V_{TXP}$ denote the voltages of signals TXN and TXP, respectively.

Note that FIG. 2A lists the bit values corresponding to the difference between the respective voltages of the TXN and TXP signals. Thus, as transmission progresses in time, the transmitter sends symbols 00, 01, 11, and 10 to the receiver.

Figure 2B:
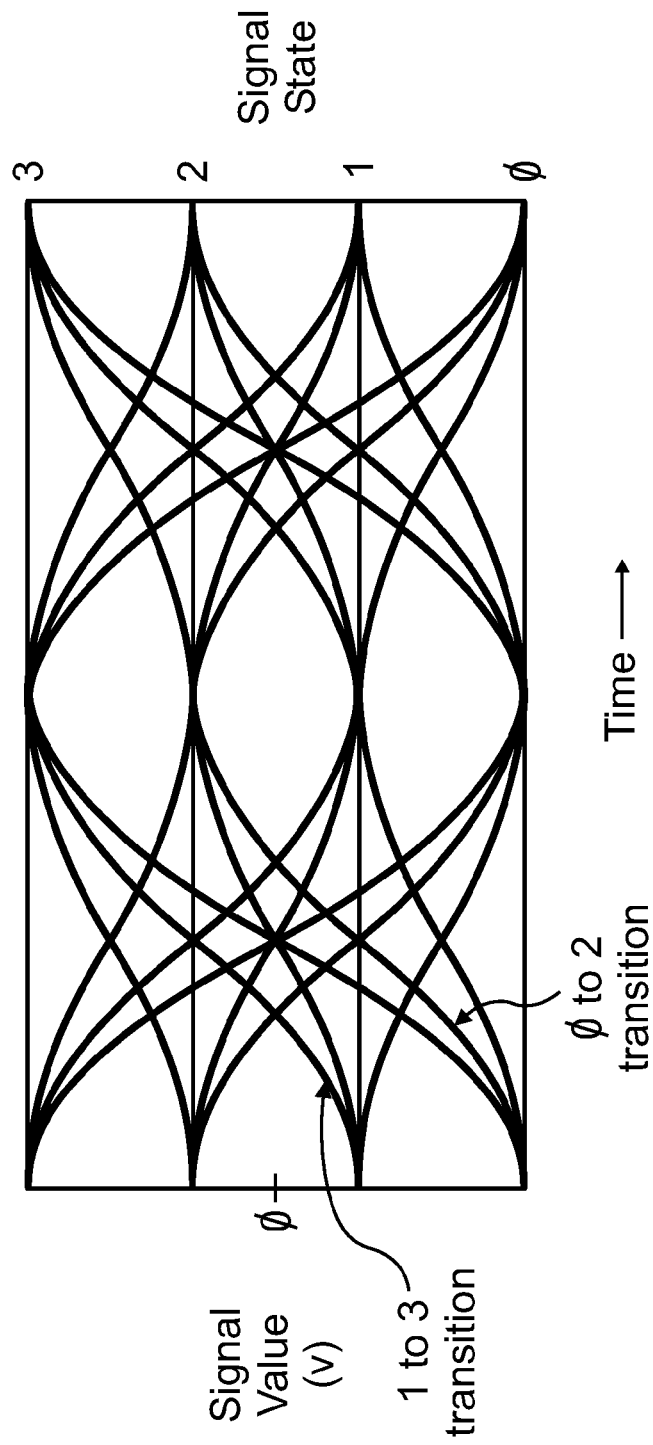

As noted, in some receiver or transceiver implementations, the rise or fall times of the PAM signals may depend on the specific transition. For example, the transition from −0.5V to +1.0V may cross the zero-voltage point at different times than the transition from −1.0V to +0.5V (note that the −0.5V, +0.5V voltages are merely examples; in the discussion of DC balance, and that other voltage levels may be considered). As another example, consider the signal transitions, as a function of time, illustrated in FIG. 2B. The example shown assumes four states, 0, 1, 2, and 3, corresponding to the signal levels shown. The figure shows all possible signal transitions among the signal states 0-3. Each state corresponds to a signal voltage level, with the center point or common mode voltage (labeled "0" in this example). Note that the transition from state 0 to state 2, for instance, crosses the center point (here, zero volts) at a different point in time than does the transition from state 1 to state 3, even though both transitions entail the same change in signal voltage. If the phase detector (e.g., a bang-band phase detector described below in connection with FIG. 2D) is limited to symmetric signal transitions, some of the transitions will be useful (they are an input to the phase detector), and some not, in that run-length is affected by the transitions between the useful states.

Figure 2C:
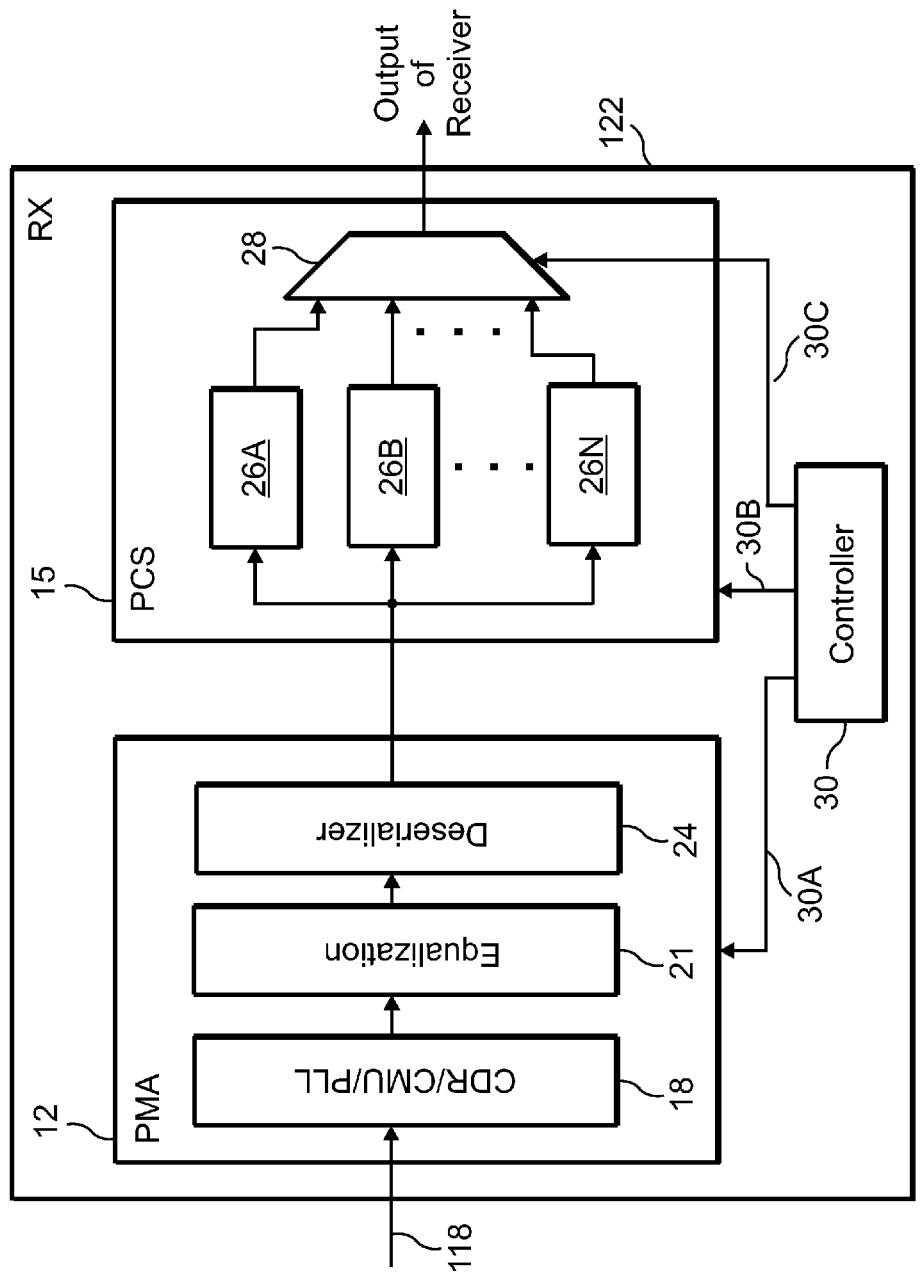

FIG. 2C illustrates a block diagram of a receiver 122 according to an exemplary embodiment that receives and operates on PAM signals. Generally speaking, receiver 122 constitutes part of the physical layer (PHY) of a communication circuit or system. The receiver in FIG. 2C might constitute, for example, receiver 122 in FIG. 1A or the receiver that is part of transceiver circuit 144B in FIG. 2A.

Receiver 122 receives the information from link 118. Typically, receiver 122 performs one or more operations on the information. Referring to FIG. 2C, generally, receiver 122 includes physical media attachment (PMA) 12 and physical coding sublayer (PCS) 15.

Receiver 122 receives information from link 118 via PMA 12. PMA 12 may process the received information, for example, by deserliazing the information (when link 118 constitutes a serial communication link). As described below in detail, PMA 12 may perform a variety of functions, such as offset cancellation (which corrects or tends to correct for semiconductor fabrication process variation), programmable equalization, etc., as desired. PMA 12 provides the processed information to PCS 15. PCS 15 may process the information in a variety of ways, for example, by decoding the information. In the embodiment shown, decoders 26A-26N perform decoding operations on the information received from PMA 12 although, in addition or instead of decoding, other operations may be performed in other embodiments.

In the embodiment shown, PMA 12 includes a signal generation circuit 18, which generates signals used to process information in receiver 122, and to provide the resulting information to deserializer 24. Signal generation circuit 18 may include a phase locked loop (PLL) circuit. Signal generation circuit 18 may also include a clock data recovery (CDR) circuit and/or a clock multiplier unit (CMU), as desired. In some embodiments, the PLL circuit may constitute a part of the CDR circuit or the CMU circuit.

Equalization circuit 21 may provide equalization to the information, as persons of ordinary skill in the art understand. In some embodiments, equalization circuit 21 may be programmable, for example, via control signal(s) 30A, under the control of controller 30. PMA 12 may perform a variety of functions, such as offset cancellation (which corrects or tends to correct for semiconductor fabrication process variation), etc., as desired. PMA 12 provides the processed information to PCS 15. Deserializer 24 converts the information from serial to parallel form.

PCS 15 may perform a variety of information processing tasks, such as decoding. In the embodiment shown, decoders 26A-26N perform, respectively, decoding operations 1-N on the information (although, in addition or instead of encoding, other operations may be performed in other embodiments, as persons of ordinary skill in the art understand). More specifically, decoder 26A may decode the information using one type of decoding, decoder 26B may decode the information using a different type of decoding, and so on to decoder 26N. A variety of decoding schemes may be used, as desired.

The results of the decoding operations are provided to multiplexer (MUX) 28. In response to control signal(s) 30C from controller 30, MUX 28 selects information decoded with a desired decoding scheme, and provides the decoded information as an output of receiver 122. Controller 30 uses signals 30B to control other operations of PCS 15. In addition to the operations described above, PCS 15 may also support clock compensation, rate matching, word alignment, error monitoring, phase compensation, and/or other operations, as desired.

Figure 2D:
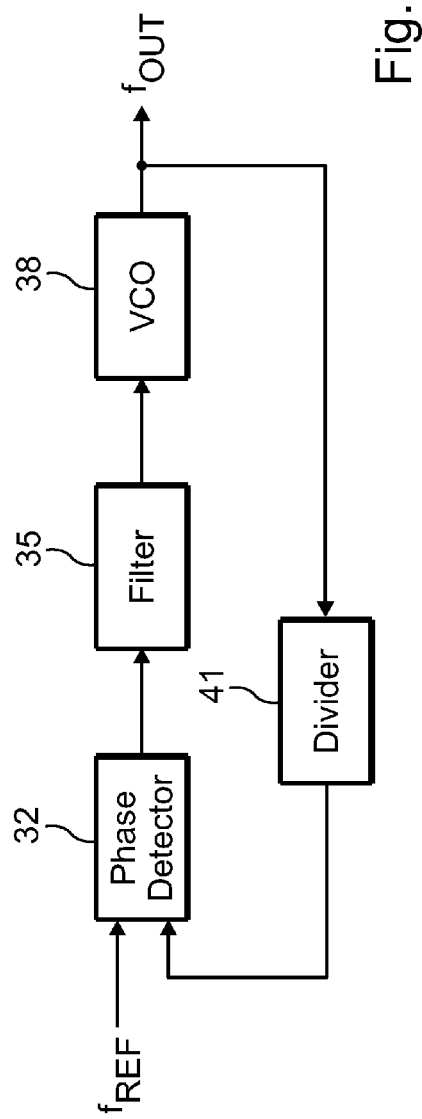

As noted above, signal generation circuit 18 may include a PLL circuit. FIG. 2D illustrates a PLL circuit that may be employed in exemplary embodiments. The PLL circuit includes phase detector 32, filter 35, voltage-controlled oscillator 38, and optionally, divider 41.

An input or reference frequency, $f_{IN}$, which may relate to or be derived from received data, drives an input of phase detector 32. The output of VCO 38, divided by divider 41 (if used) drives another input of phase detector 32. Thus, the output of phase detector 32 provides a measure of the phase difference of the two input signals of phase detector 32.

In some embodiments, phase detector 32 may constitute so-called bang-bang phase detector circuitry, although other types of phase detection circuitry may be used. A bang-bang phase detector typically includes a charge pump that provides charge to a capacitor. The capacitor provides an integration function, and provides a measure of the phase difference between frequencies $f_{IN}$ and $f_{OUT}$ (as described below).

The output of phase detector 32 drives a filter (e.g., a low-pass loop filter) 35. Filter 35 performs a filtering operation (e.g., low-pass filtering) on the output signal of phase detector 32, and provides the resulting filtered signal to VCO 38. More specifically, the output of filter 35 drives the control input of VCO 38.

In response to the control input received from filter 35, VCO 38 generates an output signal with a frequency $f_{OUT}$. The output of VCO 38, through divider 41 (if used) drives an input of phase detector 32, as noted above. Thus, the PLL circuit includes a feedback loop constructed around phase detector 32, filter 35, VCO 38, and divider 41 (if used).

The feedback loop functions to reduce the difference in phase between the frequencies $f_{IN}$ and $f_{OUT}$. In response to the frequencies $f_{IN}$ and $f_{OUT}$, phase detector 32 causes the frequency of oscillation of VCO 38 to vary so as to reduce the phase difference between the two frequencies. When the phase difference between $f_{IN}$ and $f_{OUT}$ reaches zero (or is reduced to a sufficiently small value), the PLL circuit operates in a locked mode.

When the PLL circuit operates in the locked mode, $f_{IN}=f_{OUT}/R$, where R represents the divide-by-R operation of divider 41 (if used). Stated another way, $f_{OUT}=f_{IN} \times R$. As the preceding equation shows, a change in $f_{IN}$ causes a change in the output frequency of VCO 38, i.e., $f_{OUT}$. Given that $f_{IN}$ relates to or is derived from the input data to the receiver, transitions in the data cause variations in the oscillation frequency of VCO 38.

As noted above, in PAM systems, the rise and fall times of the PAM signals may depend on the transition, i.e., may depend on the starting and final levels giving rise to the transition. For instance, referring to a PAM system that uses the signal levels shown in FIG. 2A, the transitions from various starting levels to various final levels may cross the common-mode voltage (e.g., zero in FIG. 2A) at different times Consequently, phase detector 32 (see FIG. 2D) may update the state of the PLL circuit (e.g., cause the output frequency of VCO 38 to vary) in response to a subset of transitions. According to one aspect of the disclosure, measuring and improving run-length in PAM systems may be based on the transition(s) that cause the state of the PLL circuit to be updated.

More particularly, run-length may be improved by considering and using those transitions in the data that cause phase detector 32 (e.g., a bang-band phase detector) to cause VCO 38 to speed up (i.e., an increase in $f_{OUT}$) or slow down (i.e., a decrease in $f_{OUT}$). Put another way, run-length may be determined or measured by calculating which data transitions would affect the PLL circuit, e.g., would cause the output frequency of VCO 38 to change. Various choices of encoding may be considered based on which would improve run-length, as described below in detail.

Another aspect of the disclosure relates to improving DC balance in PAM systems. In the case of PAM-4, PAM-8 or, generally, PAM-$2^N$ physical layers, DC balance might be determined based on the frequency of signal levels over a given or specified time period. The DC balance for the period corresponding to the transmission of a number of bits may be calculated as the weighted average of the transmitted voltages, i.e., an average that takes into account the frequency of occurrence of the various signal levels corresponding to various symbols or bit patterns. Note that the weighted average of the transmitted voltages is in typical systems an approximation of the true DC balance. A more accurate calculation of DC balance would depreciate the weight of prior bits by $e^{t/\tau}$, where t is the time since that bit and $\tau$ is the time constant of the circuit. Generally, with typical systems, it is sufficient to look at values of t much less than $\tau$, such that the weighting of $e^{t/\tau}$ is fairly closely approximated by $e^0$, or 1. Persons of ordinary skill in the art recognize that other approximations may be used. As an example, in a 10 Gbps link, t would typically be <100 ns with $\tau$ being 50 µs, resulting in a weighting that is within 2% of a simpler weighted average.

With respect to the calculation of weighted averages, consider for example, a PAM-4 system that uses four signal levels, −1, −0.5, +0.5, and 1 volt, respectively (see, for example, FIG. 2A). Suppose that such a system transmits two bits at the 0.5V level, and one bit at the −1V level. One would calculate the weighted average as (2×0.5)+(1×−1), or 0. Thus, such a system would have a DC balance of zero.

Note that the technique for calculating DC balance described above may be extended to any desired PAM system (PAM-$2^N$ in general). Furthermore, note that for a PAM-2 system, i.e., a system with two voltage levels, the DC balance according to the above calculation would be the same as a DC balance determined according to conventional calculations.

Generally, in the case of a PAM system, DC balance calculation may begin at an arbitrary or selected point in time, t=0. Starting at that point in time, the link voltages are examined over a desired number of bits, for example, 67 bits in some embodiments. For each transition, a running average is calculated or updated, as described above. After the voltage levels corresponding to the desired number of bids have been examined, a final weighted average is obtained.

Various choices of encoding may be considered based on which would improve DC balance, as described below in detail. By comparing the averages corresponding to respective encoding schemes, one may selection the encoding scheme that causes the DC balance to improve or correct (for the DC balance to reduce or approach or equal zero). Note that the selection of the encoding scheme may be performed on a word-by-word (one word of data) basis, as desired. Furthermore, note that the selection of the encoding scheme may be performed for more than one word of data in order to improve or correct the DC balance.

Figure 3:
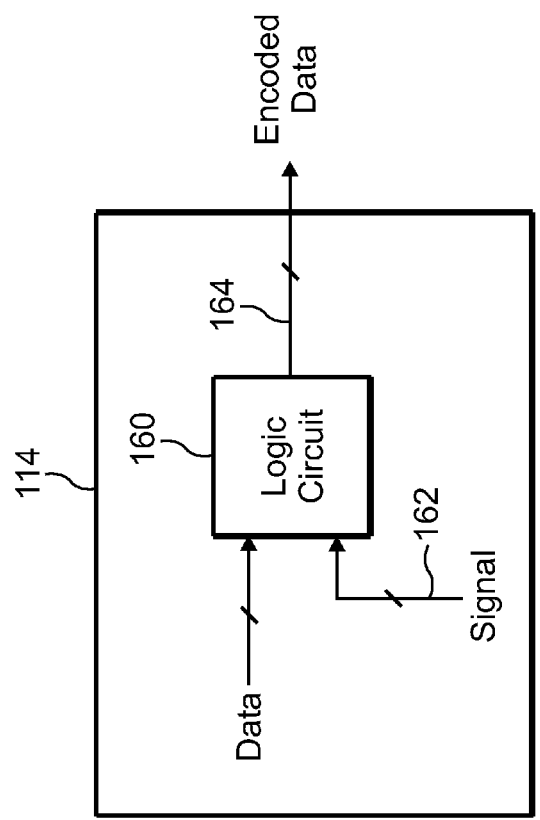
FIG. 3 shows a block diagram of a circuit for encoding according to an exemplary embodiment.

One technique for obtaining improved run-length and/or DC balance involves performing one or more logical operations on the data before transmission of data. More specifically, a logical operation may be performed between the data and another signal, e.g., a clock signal, to improve the run-length and/or DC balance. FIG. 3 shows this technique according to an exemplary embodiment.

More specifically, the circuit arrangement in FIG. 3 shows part of encoder 114 (see FIG. 1A) although, as persons of ordinary skill in the art understand, a similar arrangement may be used to implement encoding (e.g., by using encoder/decoder 146A and/or 146B) in the embodiment shown in FIG. 1B. Encoder 114 includes logic circuit 160 which, in the example shown, has two inputs. One input of logic circuit 160 receives the data to be communicated. Another input of logic circuit 160 receives an input signal 162 (for example, received from a controller (not shown) or other source), such as a clock or encoding signal. In response to the inputs, logic circuit 160 performs a logical operation on the data and the input signal, and provides the result as an output (encoded data).

In exemplary embodiments, logic circuit 160 may perform a variety of logic operations. In some embodiments, logic circuit 160 may perform more than one logic operation on the data, or on intermediate results of a logic operation on the data. In some embodiments, logic circuit 160 may perform the logic operation in a programmable or configurable manner, for example, in response to control signal(s), commands, etc., provided from one or more source(s), for example, a controller (not shown).

In one exemplary embodiment, logic circuit 160 performs an exclusive OR (XOR) operation on the data and the input signal. As a result of this operation, the run-length and/or DC balance of the encoded data may be reduced (note that, as described below, depending on the result of the operation, the protocol may determine, for example, on a word-by-word basis, whether the original data or the result(s) of one or more operations has a lower run-length and/or DC balance and, based on that determination, choose or select the desired operation (if any) to be performed on the data bits. FIG. 4A shows an example of this operation.

Specifically, FIG. 4A shows a set of data bits that, if transmitted without encoding, have a run-length of 14. The underlined portion of the data bits shows a series of 14 consecutive 0s, hence a run-length of 14. Logic circuit 160 (not shown in FIG. 4A) performs an XOR operation between the data and the input signal (e.g., a clock signal, as noted above). In the example shown, the input signal includes an alternating pattern of 0s and 1s, which may correspond to the logic levels of a clock signal or other input signal. The result, the encoded data, represents a bit-wise XOR operation between the data and the input signal.

As FIG. 4A illustrates, the encoded data have a run-length of 7. Specifically, the encoded data include a pattern of seven 1s, i.e., a run-length of 7. By using the example XOR operation to encode the original data, the embodiment shown in FIG. 3 reduces the run-length of the resulting data. Put another way, the operation converts the portion of the bit pattern that is constant to an alternating pattern, whereas the remaining bits have the same probabilistic distribution they did before the XOR operation.

In the case of PAM4, in some embodiments, one may look at or examine or consider some transitions or a subset of transitions, for example those transitions between symmetric voltages, such as −1V to 1V and −0.5V to 0.5V, as these transitions may have the most consistent times of crossing the center point or common mode voltage (e.g., zero-volt line). Grouping bits in groups of two leads to encoding choosing a number 0-3, as shown in FIG. 2A. In the example shown, the transitions of interest, that is, the transitions that will affect the phase detector, are 0→2, 2→0, 1→3, and 3→1.

By selecting every other group and adding 1 modulus 4 to it, one may obtain a transformation such as shown in FIG. 4B. Similar to FIG. 4A, the transition density is changed as a result. Note that another way of considering the special case of non-return to zero (NRZ), which is PAM2 as shown in FIG. 4A, has every other group adding 1 modulus 2. Referring to FIG. 4B, the underlining between the numbers indicates transitions that are useful to the CDR circuit (they are inputs to the bang-bang phase detector). The input data have a single transition and a maximum run-length of 9. The encoded data have 8 transitions and a maximum run-length of 4.

Note that, given a random data pattern, applying the XOR operation (or other logic operation, generally) has an equal chance of making the maximum run-length either longer or shorter. For example, applying the pattern to {0101010101} might turn a short run-length pattern into a long run-length pattern. Thus, in some embodiments, the logic operation (e.g., XOR) may be applied when the original data have a relatively long run-length (e.g., RL>K, where K represents a constant or variable). Similar consideration may be given to selecting encoding to improve DC balance, as described above.

As an alternative, in some embodiments, run-length and/or DC balance may be computed for the original data before the application of the logic operation, and also for the result of applying the logic operation to the data. A selection or choice may be made between those two results, depending on which provides a better (shorter) run-length and/or DC balance, for example, by using a single bit or a set of one or more bits. Assuming the scenario where the shorter run-length is chosen, the odds of a run of length of r starting at any given position for relatively large values of r (for example, r>20) is approximately $2^{-r}$ for the original data (which may or may not have been encoded). But the odds of a run of length of r starting at any given position is reduced to $2^{-2r}$ after the application of the encoding scheme described above. For r=20, the encoding scheme provides three orders of magnitude decrease in the probability of this run-length occurring (i.e., 1,000-fold decrease). For r=40, the encoding scheme provides six orders of magnitude improvement in the probability of this long run-length occurring (i.e., 1,000,000-fold decrease). In the case of PAM4 with relevant transitions being defined as above, the odds of a run of length r starting at any given position for relatively large values of r (for example, r>20) is approximately $4^{-r}$ for the original data (which may or may not have been encoded). But the odds of a run-length of r starting at any given position is reduced to $4^{-2r}$ after the application of the encoding scheme described above.

The concept described above may be used in a variety of situations and embodiments. For example, the logic operation (e.g., XOR) may be used on data that already have or include some kind of encoding. As another example, the logical operation may be an operation other than XOR, for example, exclusive NOR (XNOR), etc., or a complex logic operation, for example, an operation described by a Boolean logic expression. As an example, a generalization of XOR can be used for PAM-N, where (+1 modulus N) is added to every other code group, for instance as shown in FIG. 4B. Furthermore, a variety of bit patterns may be used for the input signal, rather than the example alternating binary 0s and 1s (clock pattern) shown in FIG. 4A. For example, the pattern 001100110011 (a half-cycle clock), a semi-random or pseudo-random pattern, or any other desired pattern may be used. The length of the pattern may be the number of data bits in the payload or data. As yet another example, the encoding scheme may be used in a transceiver, rather than a transmitter, for example, in an encoder or encoder/decoder block (see FIG. 1B).

As persons of ordinary skill in the art understand, in some protocols, e.g. Interlaken, PCIe gen3, or SONET, the data are scrambled by with a linear feedback shift-register (LFSR). The LFSR is characterized by the polynomial and the initialization seed. The pattern of bits that are transmitted for a given word are a function of the current state of the LFSR. If two LFSRs, e.g., LFSR$_1$ and LFSR$_2$, are used, for example, operating in parallel and with different initialization seed, then a choice may be made between LFSR$_1$ and LFSR$_2$ based on various selection criteria, such as run-length, DC-wander, and/or DC balance, or other criteria, as desired.

Another encoding technique uses scrambling of the bit ordering (or re-ordering of the data bits), i.e., changing or scrambling or re-ordering the order of the data bits. Given a sequence of data bits that has a relatively long run-length and/or relatively large DC balance, scrambling the order of the bits separates out the constant bits, thus on average reducing the run-length and/or DC balance. The optimal scheme for scrambling depends on the maximum run-length and/or DC balance that is to be avoided or is undesired, and on the payload or data size.

Figure 5:
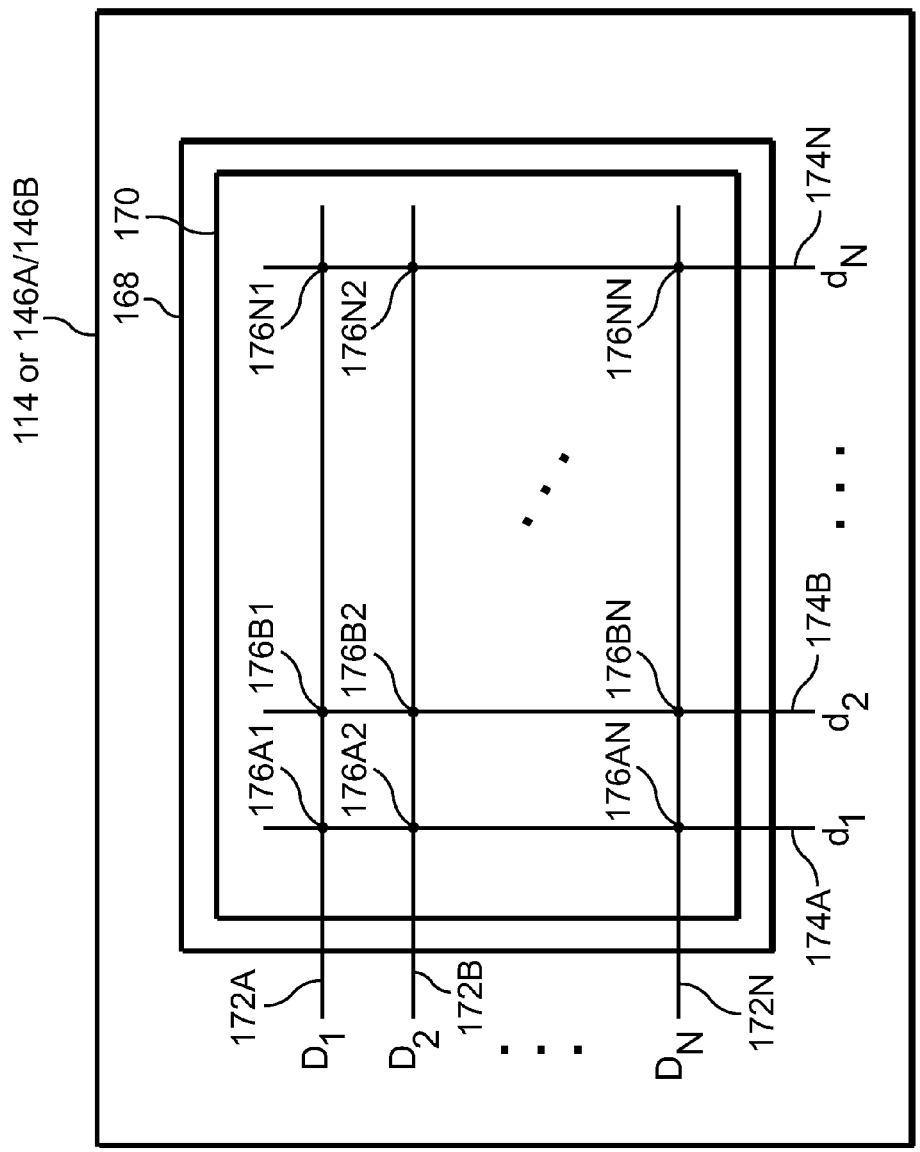
FIG. 5 illustrates a block diagram of a circuit for scrambling bit orders or re-ordering bits according to an exemplary embodiment.

Bit order scrambling may be implemented in a variety of ways. Generally, a circuit, such as a bit order scrambling circuit, however implemented, may receive the data bits, and then scramble the order to produce or output encoded or scrambled-order data bits. In typical implementations, a bit would have a choice of going to one of two locations, assuming a single bit choice, or perhaps as many as 2-3 locations. In such a situation, a multiplexer (MUX) may be used to implement or realize bit order scrambling. For a more general implementation that can accommodate virtually any bit order permutation or ordering, a circuit using a switch matrix, as shown in FIG. 5, may be employed. Specifically, encoder 114 (if, for example, system 100 in FIG. 1A is used) or encoder/decoder 146A/146B (if, for example, system 140 in FIG. 1B is used) includes a bit ordering block or circuit 168. Bit ordering block 168 includes switch matrix 170. Switch matrix 170 in FIG. 5 allows any given data bit, say, bit 1, to be output or re-ordered to any arbitrary new position, for example, to bit 12.

Switch matrix 170 includes a circuit or network of switches, labeled 176A1-176NN. Switches 176A1-176NN are coupled to a series of data bit lines 172A-172N (e.g., rows) and 174A-174N (e.g., columns). Each of switches 176A1-176NN may selectively (e.g., under the control of a controller or similar circuit (not shown)) couple a respective one of lines 172A-172N to a respective one of lines 174A-174N.

Original (input) data bits, denoted as $D_1$-$D_N$ in FIG. 5, are coupled to lines 172A-172N. By closing selected or desired switches, input bits $D_1$-$D_N$ may be coupled to respective desired or selected output lines (174A-174N) to provide output or encoded data bits $d_1$-$d_N$. For example, by closing switch 176B1, input data bit $D_1$ is output as output data bit $d_2$. As another example, by closing switch 176AN, input data bit $D_N$ is output as output data bit $d_1$, etc.

As persons of ordinary skill in the art would understand, MUXs and the circuit in FIG. 5 represent merely exemplary implementations of data bit order scrambling. Other circuits or schemes may be used, depending on factors such as specifications for a given implementation, available technology, semiconductor fabrication process characteristics, desired speed of operation, etc. Examples include multiplexers, Boolean logic circuits, shift registers (e.g., linear feedback shift registers), look-up tables, finite-state machines, and the like.

Bit order scrambling may be performed using a variety of bit order scrambling schemes (for example, ways to control the switches in the circuit of FIG. 5 or to process the bits using a MUX, as described above). As one example, an order scrambling on a 32-bit payload may use:

new-bit-position(x)={old-bit-position(x)×5} mod 32, where new-bit-position and old-bit-position represent, respectively, the position of bit x after and before the encoding. Since the numbers 5 and 32 are relatively prime, this bit order scrambling provides a full re-ordering of the data bits. The numbers 5 and 32 constitute merely illustrative numbers used in some embodiments. Other numbers, such as other relative prime numbers, may be used in other exemplary embodiments, as persons of ordinary skill in the art understand.

FIG. 6 shows an example of data order scrambling according to the scheme described above. Specifically, FIG. 6 shows a set of input data bits that, if transmitted without this encoding scheme (scrambling), have a run-length of 14. The encoding scheme described above is applied to the data bits. In this example, the ordering or bit order scrambling used is {1, 6, 11, 16, 21, 26, 31, 5, 10, 15, 20, 25, 30, 4, 9, 14, 19, 24, 29, 3, 8, 13, 18, 23, 28, 2, 7, 12, 17, 22, 27}. The result, the encoded data, represents the original data bits reordered according to the above pattern or order. As FIG. 6 illustrates, the encoded data have a run-length of 4. Specifically, the encoded data include the pattern "0000," i.e., a run-length of 4. By using the example reordering shown to encode the original data, the example shown in FIG. 6 reduces the run-length of the resulting data. Similar considerations may be given to selecting encoding in order to reduce DC balance, as described above. In the case of PAM-N, it may be that scrambling is done with groups of bits that are encoded together, e.g. $\log_2(N)$ bits at a time. In this case, no long-term change to the DC balance is caused by the bit-reordering, although the run-length may be affected. Alternatively, the individual bits may be scrambled without regard to the encoding groups, in which case both the run-length and the DC balance may be affected. As an example, given the bit-stream 0011, the DC balance is (1+−0.5)=0.5. Reordering the bits to 0101 results in a DC balance of (0.5+0.5)=1, whereas reordering the bits to 1010 results in a DC balance of (−1+−1)=−2.

Figure 7:
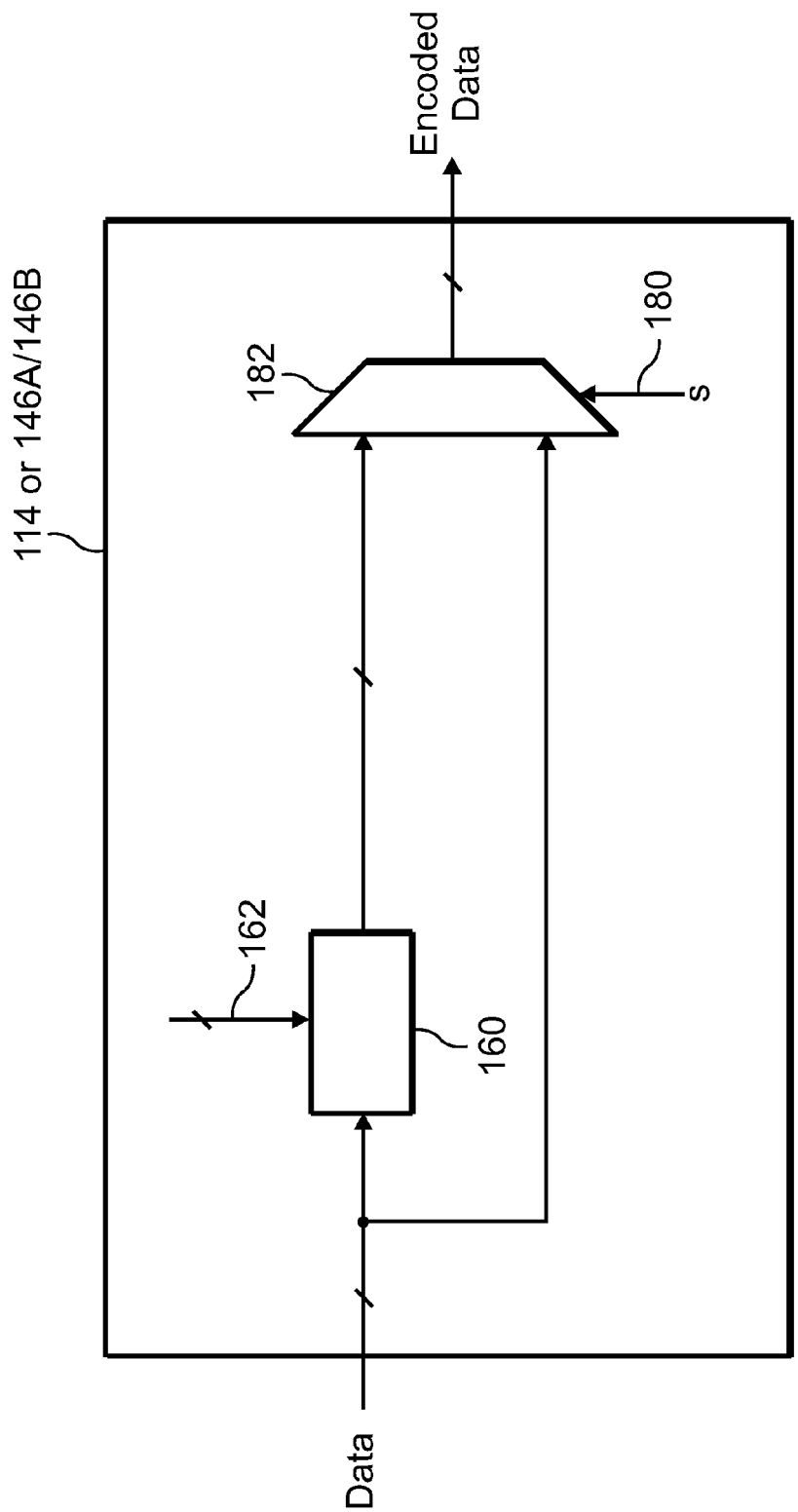
FIG. 7 shows a circuit according to an exemplary embodiment for selectively using encoding via a logic operation.

In some embodiments, a choice may be made whether to use the original data or data encoded by the above techniques. FIG. 7 shows a circuit according to an exemplary embodiment for selectively using encoding via a logic operation. Specifically, the figure illustrates a block diagram of an encoder 114 (or encoder/decoder 146A/146B) that selectively uses a logic operation. Input data (which may or may not be encoded) are provided to logic circuit 160 and also to one input of MUX 182. Logic circuit 160 processes the data to reduce the run-length and/or DC balance, as described above.

In response to a select signal s (labeled as 180), MUX 182 provides as its output signal either the original input data or the processed data at the output of logic circuit 160. In this manner, either the original data or the data processed by logic circuit 160 may be used, as desired, depending on various factors, as persons of ordinary skill in the art would understand.

Figure 8:
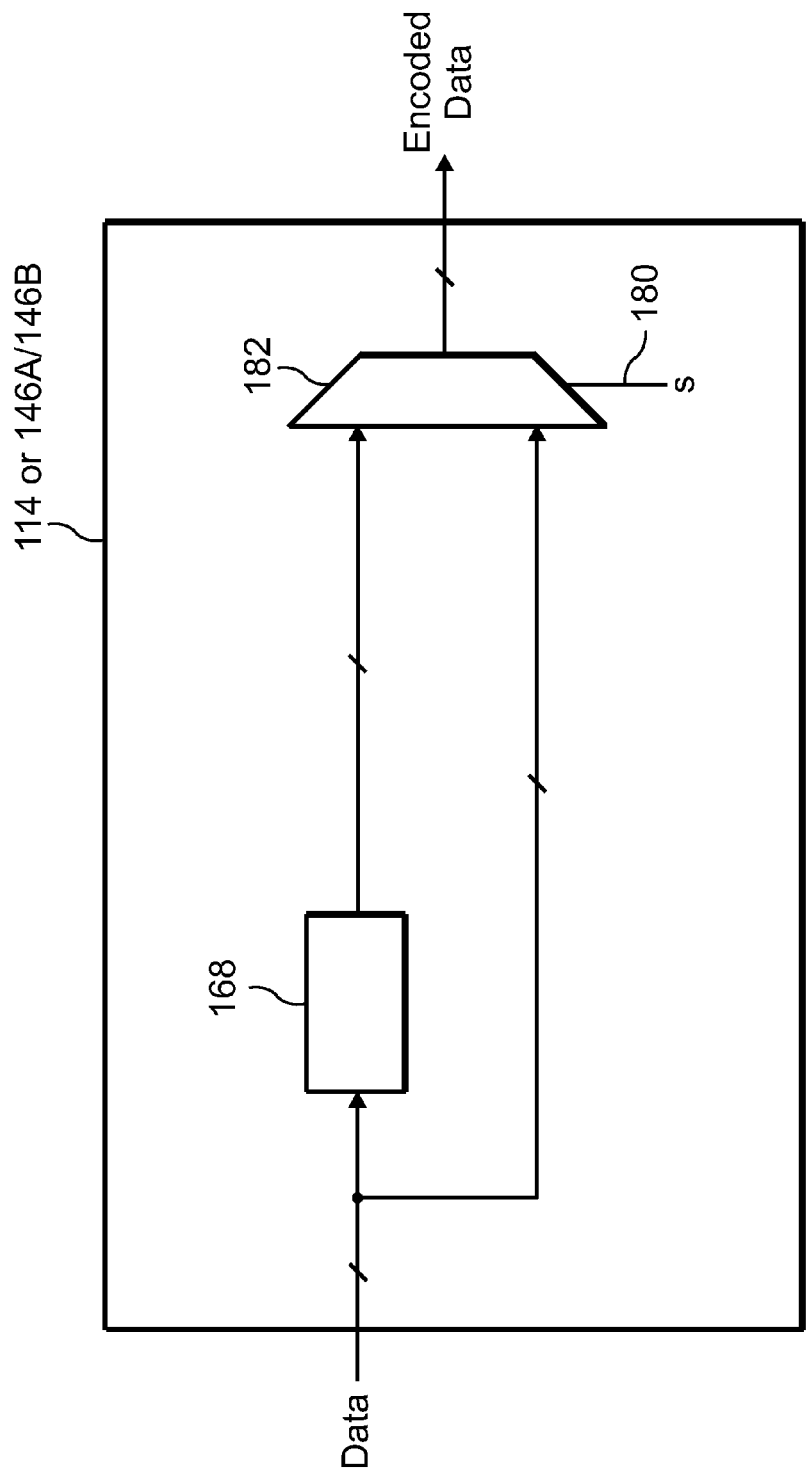
FIG. 8 illustrates a circuit according to an exemplary embodiment for selectively using encoding by bit ordering.

FIG. 8 illustrates a circuit according to an exemplary embodiment for selectively using encoding by bit ordering. Specifically, the figure illustrates a block diagram of an encoder 114 (or encoder/decoder 146A/146B) that selectively uses a bit ordering operation. Input data (which may or may not be encoded) are provided to bit ordering circuit 168 and also to one input of MUX 182. Bit ordering circuit 168 processes the data to reduce the run-length and/or DC balance, as described above.

In response to a select signal s (labeled as 180), MUX 182 provides as its output signal either the original input data or the processed data at the output of bit ordering circuit 168. In this manner, either the original data or the data processed by bit ordering circuit 168 may be used, as desired, depending on various factors, as persons of ordinary skill in the art would understand.

Figure 9:
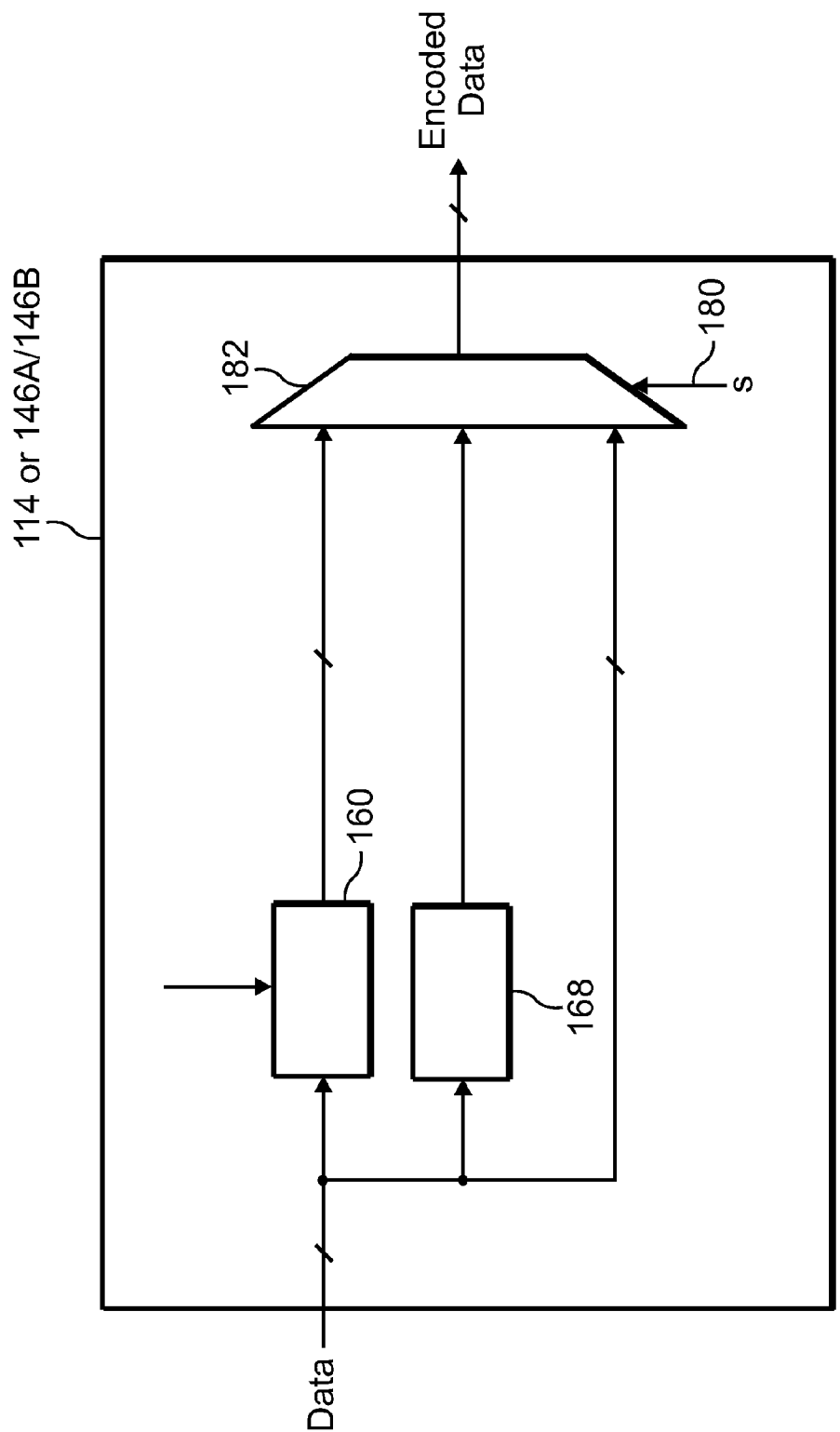
FIG. 9 depicts a circuit according to an exemplary embodiment for selectively using encoding via a logic operation or bit ordering.

FIG. 9 shows a circuit according to an exemplary embodiment for selectively using encoding via a logic operation or bit ordering. This circuit can provide as an output either the original data (which may or may not be encoded), the original data as encoded via a logic operation, or the original data as encoded via bit ordering. Thus, the circuit provides a flexible scheme for selectively encoding the data.

More specifically, the figure illustrates a block diagram of an encoder 114 (or encoder/decoder 146A/146B) that selectively uses encoding via a logic operation or a bit ordering operation. Input data are provided to logic circuit 160, to bit ordering circuit 168, and also to one input of MUX 182. Logic circuit 160 processes the data to reduce the run-length and/or DC balance, as described above. Similarly, bit ordering circuit 168 processes the data to reduce the run-length and/or DC balance, as described above.

In response to a select signal s (labeled as 180), MUX 182 provides as its output signal either the original data, the processed data at the output of logic circuit 160, or the processed data at the output of bit ordering circuit 168. In this manner, either the original data, the data as processed by logic circuit 160, or the data as processed by bit ordering circuit 168 may be used, as desired, depending on various factors, as persons of ordinary skill in the art would understand.

In this scenario, MUX 182 enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size and/or DC balance value. Note that in this situation, the MUX select signal, s, includes two bits, which allows the selection of one of the three MUX input signals.

As noted, two or more encoding schemes or techniques may be combined. For example, in some embodiments, the logical operation may be combined with the data bit ordering or bit order scrambling. For instance, in one embodiment, the XOR operation (or another logic operation) may be combined with data bit order scrambling, and to reorder the bits in groups, for example, in groups of 2 (or other desired number). A run in the original payload or data would have transitions (0 to 1 or 1 to 0) every two bits after the XOR operation. Spreading out this new set of data transitions would place an upper bound on the maximum run-length.

Figure 10A:
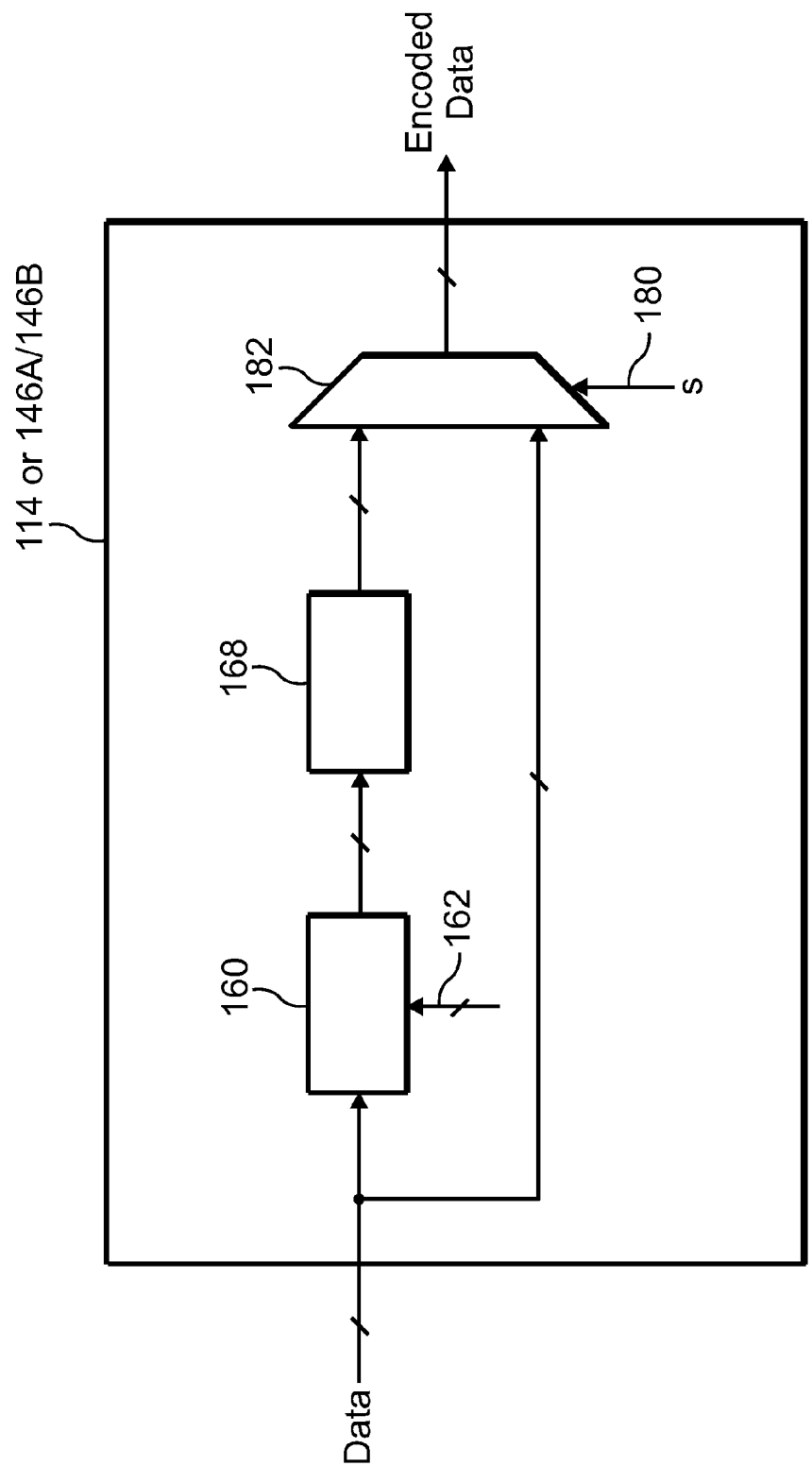
FIGS. 10A-10B illustrate block diagrams of circuits according to exemplary embodiments for performing both a logic operation and a bit ordering scheme to encode data.

FIG. 10A shows a block diagram of an encoder 114 (or encoder/decoder 146A/146B) that uses both the logic operation and the bit ordering scheme. Input data are provided to logic circuit 160 and also to one input of MUX 182. Logic circuit 160 processes the data to reduce the run-length, as described above. The data at the output of logic circuit 160 are provided to bit ordering circuit 168.

Figure 10B:
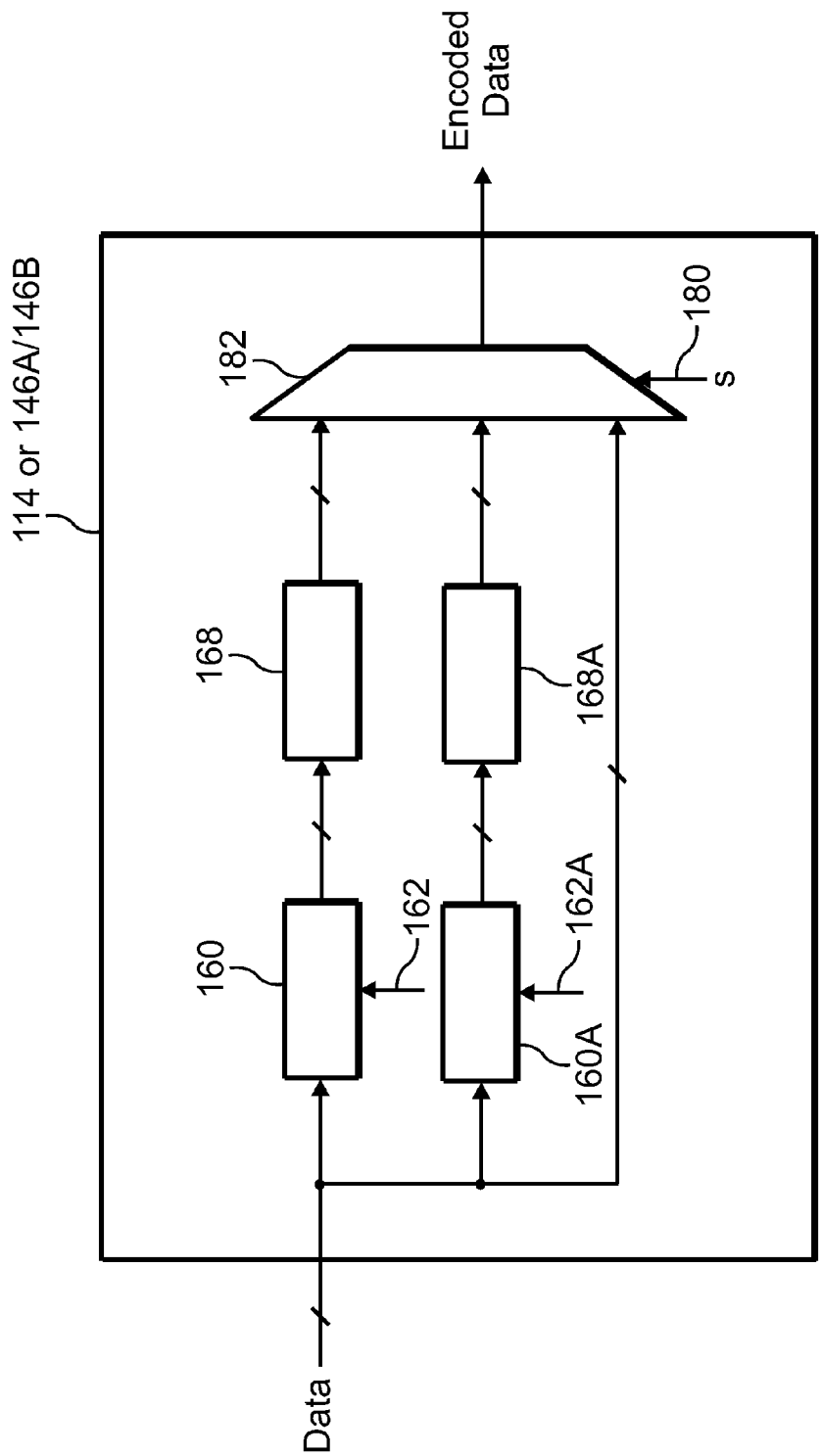

Bit ordering circuit 168 processes the data to reduce the run-length and/or DC balance, as described above. The data at the output of bit ordering circuit 168 drive a second input of multiplexer MUX 182. In response to a select signal s (labeled as 180), MUX 182 provides as its output signal either the original data or the processed data at the output of bit ordering circuit 168. In this manner, either the original data or the data processed by logic circuit 160 and bit ordering circuit 168 may be used, as desired, depending on factors such as relative run-length sizes and/or DC balance values. FIG. 10B shows a block diagram of another encoder 114 (or encoder/decoder 146A/146B) that uses both the logic operation and the bit ordering scheme. The circuit in FIG. 10B includes logic circuit 160 and bit ordering circuit 168, which operate similarly to the respective blocks in the circuit in FIG. 10A. In addition, however, the circuit in FIG.

10B includes logic circuit 160A and bit ordering circuit 168A. Generally, one or both of logic circuit 160A and bit ordering circuit 168A performs a different logic operation or bit ordering operation than do logic circuit 160 and bit ordering circuit 168, respectively. In other words, in response to input signal 162A (which may be the same or different from input signal 162), logic circuit 160A performs a logic operation on the data. Similarly, bit ordering circuit 168A may perform the same or a different bit ordering operation as does bit ordering circuit 168. MUX 182 allows the selection as the encoded data of the original data, the data as encoded by logic circuit 160 and bit ordering circuit 168, or the data as encoded by logic circuit 160A and bit ordering circuit 168A. Thus, the circuit in FIG. 10B allows for a more flexible encoding operation, depending on a desired implementation and end-use. As persons of ordinary skill in the art who have the benefit of the description of the disclosed concepts understand, more than two logic circuits and/or more than two bit ordering circuits may be used, as desired, by making appropriate modifications to the circuit shown.

Figure 11A:
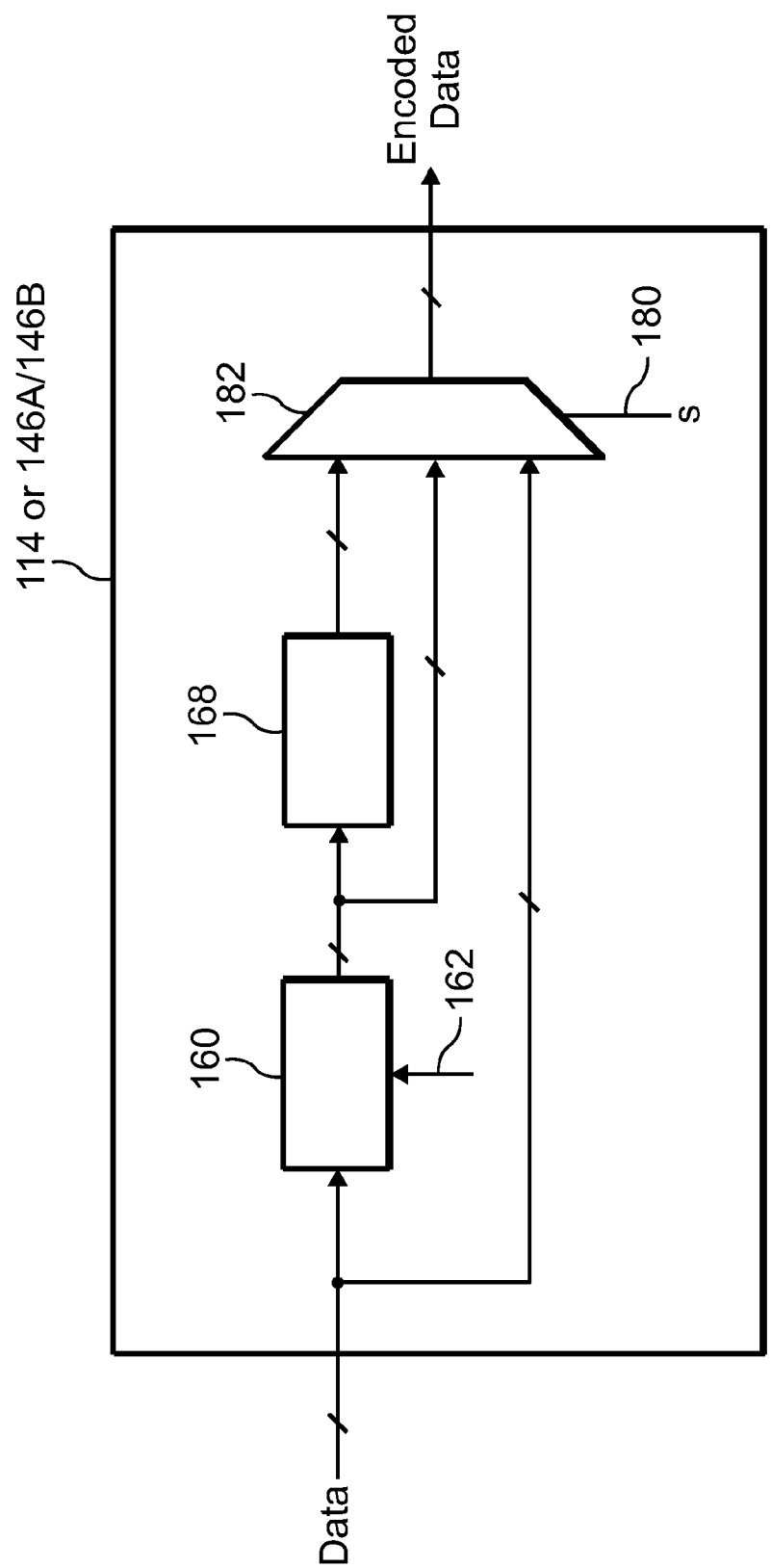
FIGS. 11A-11B show block diagrams of circuits according to exemplary embodiments for selectively performing a logic operation and/or a bit ordering scheme to encode data.
Figure 11B:
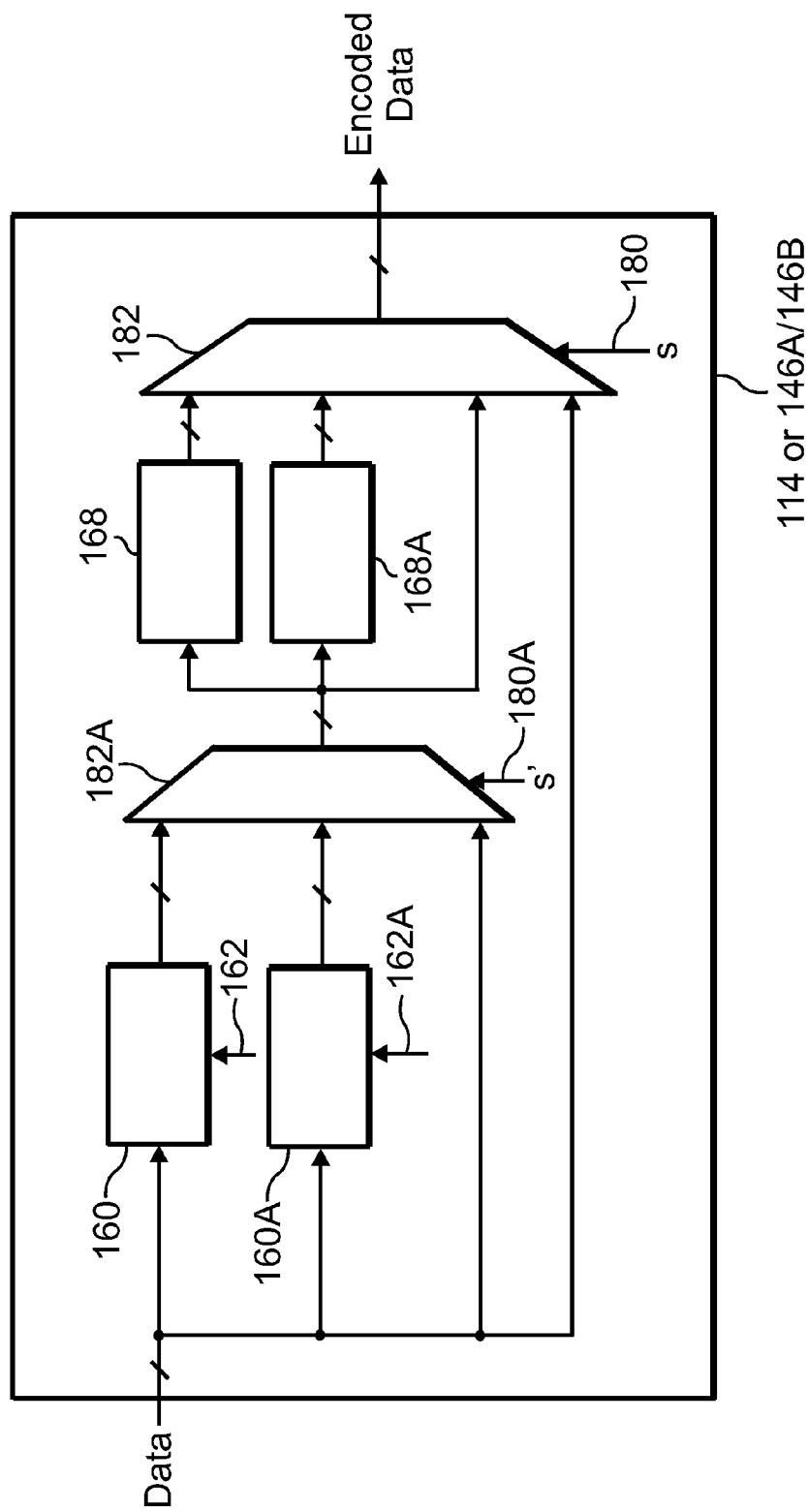

In some embodiments, the output of logic circuit 160 may drive a third input of MUX 182. FIG. 11A illustrates an exemplary embodiment that uses this technique. In this scenario, the MUX enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size and/or DC balance value. Note that in this situation, the MUX select signal, s, includes two bits, which allows the selection of one of the three MUX input signals. FIG. 11B shows a block diagram of another encoder 114 (or encoder/decoder 146A/146B) that is a variation of the circuit in FIG. 11A. The circuit in FIG. 11B includes logic circuit 160, logic circuit 160A, bit ordering circuit 168, and bit ordering circuit 168A, which operate similarly to the respective blocks in the circuit in FIG. 11A. The encoder circuit in FIG. 11B uses two MUXs, labeled as 182 and 182A. In response to select signal s' (labeled as 180A), MUX 182A enables the selection of three sets of data, i.e., the original data, the data at the output of logic circuit 160A, or the data at the output of bit ordering circuit 168A, and provides the selected input at its output. The output of MUX 182A drives the respective inputs of bit ordering circuits 168 and 168A, and an input of MUX 182. The original data provide an additional input to MUX 182. In response to select signal s (labeled as 180), MUX 182 enables the selection of four sets of data, i.e., the original data, the data at the output of bit ordering circuit 168A, the data at the output of bit ordering circuit 168, and the data at the output of MUX 182A, and provides the selected input at its output as encoded data. Generally, logic circuit 160A may perform a different logic operation than logic circuit 160. In other words, in response to input signal 162A (which may be the same or different from input signal 162), logic circuit 160A performs a logic operation on the data. Similarly, bit ordering circuit 168A may perform a different bit ordering operation than bit ordering circuit 168. Thus, the circuit in FIG. 11B allows for a more flexible encoding operation, depending on a desired implementation and end-use. As persons of ordinary skill in the art who have the benefit of the description of the disclosed concepts understand, more than two logic circuits, more than two bit ordering circuits, and/or more than two MUXs may be used, as desired, by making appropriate modifications to the circuit shown.

A variety of options may be used to provide the select bit(s), s. For example, in some embodiments, the select bit(s) may be provided separately from the data. As another example, in other embodiments, the select bit(s) may be provided on the same lines as the data, for example, as bit(s) that precede the data.

A variety of patterns or operations may be used for the logic operation and/or the ordering operation. The optimal pattern depends on the maximum target or desired run-length or desired DC balance value and the payload or data size. A variety of logic operations (XOR is one example) may be performed, and a variety of bit patterns (input signal, as shown in FIGS. 3-4) may be used, with a repeating "01" pattern (alternating binary zeros and ones, with a desired length, for example, to match the number of data bits) as one example.

FIG. 12 shows an example of combining data bit order scrambling or reordering together with an XOR operation to reduce run-length. In the example shown, the original data (which may or may not have had some kind of encoding applied to them) have a run-length of 14. The underlined portion shows a string of 14 zeros, giving rise to the run-length of 14. An XOR operation with the data, using a repeating "01" pattern, produces encoded data with a run-length of seven. Note that the XOR operation results in the underlined portion of the original data to become "scattered," or move or spread out through the data.

An additional encoding by using ordering or bit order scrambling with the pattern or order shown, further reduces the run-length to 3 in the output data. The underlined portion of the output data shows the further scattering, moving, or spreading out of the bits that caused the previous higher run-lengths. Thus, the encodings provided by the XOR operation and the ordering operation cause the breaking up or reduction of the relatively long runs of repeating bit patterns, thus reducing the resulting or output run-length. Similar considerations may be applied to DC balance values in selecting encoding schemes, as described above.

In some embodiments, instead of, or in addition to, reducing run-length, other metrics or figures of merit may be considered. In some embodiments, metrics other than run-length and/or DC balance may be optimized that may reduce the probability of bit error(s) by making the detection of logic ones and zeros easier for the receiver (or the receiving transceiver) in the presence of line noise, signal distortion, or other factors. For example, it may be that bit pattern {00000010000001}, which has a run-length of 6, is more susceptible to bit error than an alternative, such as bit pattern {010000000010011011}, which has more transitions, but a run-length of 8.

As another example, in some embodiments, metrics related to power dissipation or consumption, in one or more parts (or all of) of communication apparatus (see, for example, FIGS. 1A-1B) may be included or used. For instance, subject to meeting run-length and/or DC balance specifications, it may be preferable to choose the polynomial or pattern that has fewer total transitions in order to reduce dynamic power consumption.

As yet another example, the existence and/or level, number, and/or severity of various system or circuit conditions may be used as a metric. For instance, priority may be given to reducing run-length and/or DC balance when relatively high switching activity on one or more neighboring lane(s) exists or is detected. Reducing the run-length and/or DC balance may reduce the probability of cross-talk in such a scenario. The priority may be increased, for example, as more switching activity is detected.

An example of another metric is running disparity, which constitutes a measure of the imbalance between 0s and 1s in the data. For example, a data packet or stream that includes 450 0s and 550 1s (i.e., a total of 450+550, or 1,000 bits) has a running disparity of +100, and an imbalance of (100/1000)×100%, or 10%. With the application of logic operation and bit ordering schemes, relatively short run-lengths, say, less than 10-15, may still occur relatively frequently. Rather than reduce the relatively short run-lengths and/or DC balance, the logic operation scheme may be used to optimize or improve a different metric, such as the running disparity (note that the bit reordering scheme should not change the running disparity). A goal of limiting the running disparity is to limit the variation from DC balance–the amount by which the average voltage differs from the common-mode voltage. As explained above, for typical systems, a good approximation of the quality of DC balance for PAM2 (also known as NRZ) is the running disparity imbalance. In higher order PAM, such as PAM4, the DC balance is approximated by the weighted sum of the voltages over time. Without loss of generality, one may refer to optimizing DC balance and include in it any heuristic method, such as weighted voltage over time, weighted voltage taking into account the exponential decay, running disparity, or other approximations.

Figure 13:
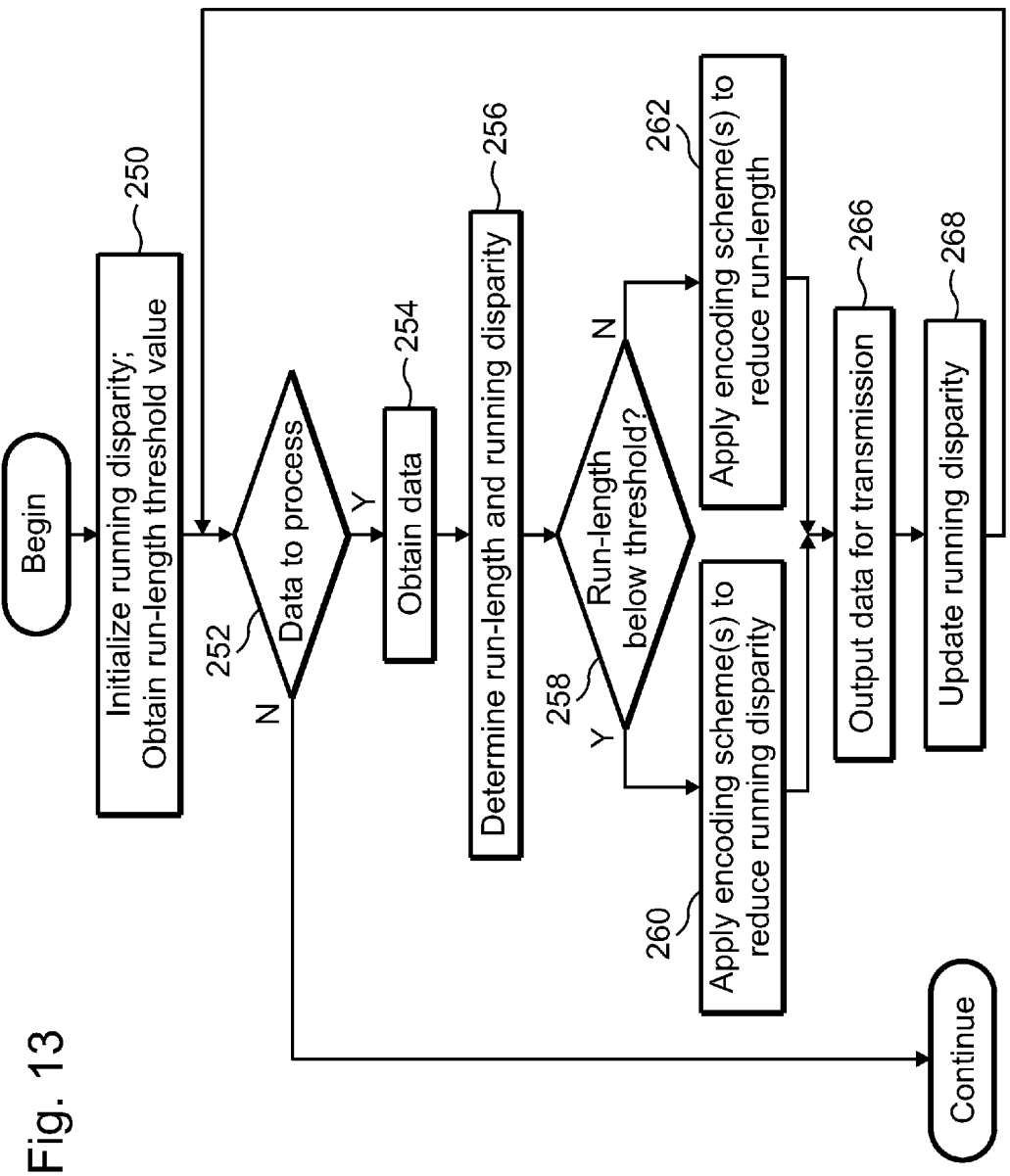
FIG. 13 depicts a flow diagram of a technique for selectively improving DC balance according to an exemplary embodiment.

In some embodiments, the optimization or improvement may be performed based on a set of criteria, such as a threshold value. For example, in some embodiments, DC balance optimization or improvement may be performed for those occurrences (e.g., over 90% of occurrences) where the run-length is below a target threshold. FIG. 13 shows a flow diagram of a technique for selectively improving DC balance according to an exemplary embodiment.

At 250, the a running estimate of the DC balance value is initialized. Also, a run-length threshold value is obtained (e.g., from the user, from storage, as a parameter, etc.). Optionally, in some embodiments, a variation from DC balance threshold value may also be obtained (e.g., from the user, from storage, as a parameter, etc.). The variation from DC balance threshold value may optionally be used, as described below.

At 252, a check is made to determine whether data to process are available. If not (e.g., the end of the data transmission has been reached, data transmission has not commenced, etc.), the technique continues with follow-on tasks (if any). If data are available, however, at 254 the data are obtained. The data may or may not have encoding(s) applied to them already. For example, the run-length and/or DC balance may have been reduced by using one or more encoding scheme(s), such as those described above.

At 256, the run-length and DC balance estimation for the data are determined. At 258, a determination is made whether the run-length is below the run-length threshold value. If not, then the run-length is relatively high (relative to the threshold used or other desired target or number). Thus, at 262, one or more encoding schemes, such as those described above, may be applied to the data to reduce the run-length.

Optionally, a determination may be made in some embodiments which of several schemes would reduce run-length the most, while also improving DC balance. The encoding scheme(s) may be selected based on that determination and applied to the data.

As another option, in some embodiments a determination is made of the effect of the encoding scheme(s) on DC balance as well as run-length. The encoding scheme(s) that achieves the best or improved DC balance (e.g., least increase(s) in DC imbalance) while most impact or affect run-length (e.g., most increase(s) in run-length) may be selected and applied to the data.

Referring to the determination at 258, if the run-length is below the run-length threshold value, then the run-length value may be deemed "tolerable." For instance, consider an embodiment where an XOR operation with a desired bit pattern is applied to the data. The data resulting from an XOR operation (or data resulting from using different bit patterns to perform the XOR operation) have a different DC balance than the data without the XOR operation. In some cases, the variation from good or acceptable DC balance may be deemed relatively high. At 260, one or more encoding schemes, such as those described above, may be applied to the data to improve the DC balance.

Optionally, a determination may be made in some embodiments which of several schemes would improve the DC balance the most, while also improving run-length. The encoding scheme(s) may be selected based on that determination and applied to the data.

As another option, in some embodiments a determination is made of the effect of the encoding scheme(s) on DC balance as well as run-length. The encoding scheme(s) that least impact or affect run-length (e.g., most increase(s) in run-length) while most impact or affect the DC balance (e.g., least increase(s) in DC imbalance) may be selected and applied to the data.

Alternatively, and optionally, a determination may be made in some embodiments whether the variation from DC balance is below the DC balance threshold value (optionally obtained at 250, as described above). If so, no changes to the data may be made. If not, however, one or more encoding schemes, such as those described above, may be applied to the data to reduce the variation from or in the DC balance. In either case, control passes to 266.

Subsequent to 260 or 262, at 266, the data are output, for example, for transmission to a destination. At 268, the DC balance estimation is updated. The updating of DC balance estimation may optionally be made conditional on a flag, for example, to indicate whether any changes to the data have been made that would affect the DC balance. Subsequently, control returns to 252 to check for data availability, as described above.

By keeping track of the DC balance estimation and choosing the pattern (e.g., the original data or the data with the XOR operation applied) that minimizes the DC balance variation from a baseline or threshold value, the DC balance variation may be minimized, optimized, or generally improved in some embodiments. In some embodiments, in the case of relatively long run-lengths and/or relatively high DC balance, the pattern or encoding that produces a shorter run-length and/or lower DC balance may be selected (e.g., one or more bit patterns used to perform an XOR operation on the data). In some embodiments, for relatively short run-lengths and/or relatively low DC balance, the pattern that improves or most improves the balance between 0s and is may be selected.

Figure 14:
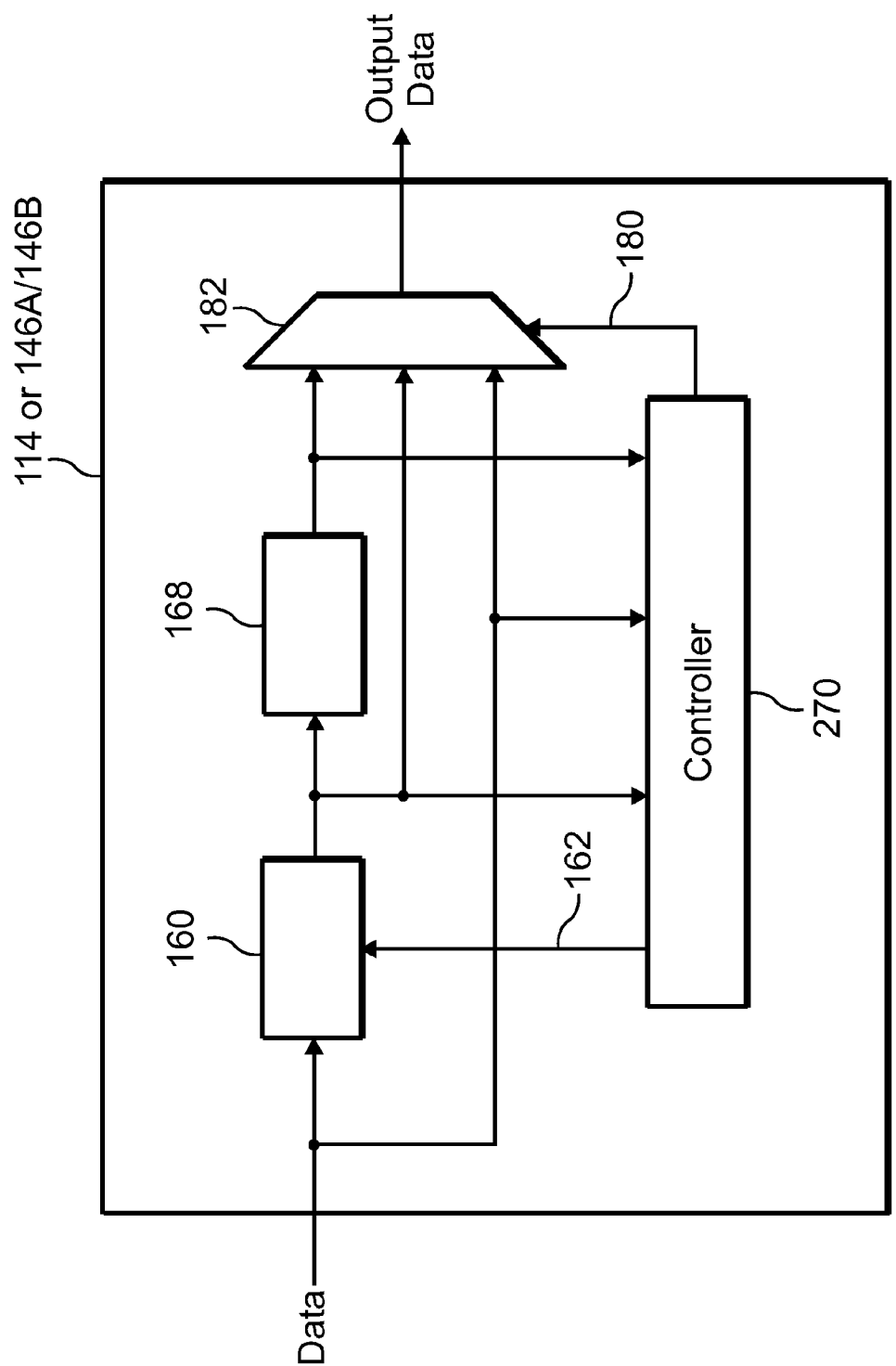
FIG. 14 shows a block diagram of an embodiment for selectively improving DC balance and/or run-length according to an exemplary embodiment.

FIG. 14 depicts a block diagram of a circuit for improving DC balance and run-length, according to an exemplary embodiment. The embodiment shown includes a transmitter 114 (or transceiver 146A or 146B), which includes logic circuit 160, bit ordering circuit 168, MUX 182, and controller 270. The circuit arrangement in the exemplary embodiment shown is configurable and may provide a variety of functions. For example, in some embodiments, the circuit arrangement may provide the functionality shown in the flow diagram of FIG. 13.

Referring to the embodiment shown in FIG. 14, in some variations, one or the other of logic circuit 160 and bit ordering circuit 168 may be used. The choice of configuration depends on the desired encoding, the resulting improvement in run-length and/or DC balance, circuit complexity, and the like, as persons of ordinary skill in the art would understand.

The input data (which may or may not have been encoded) provide one input of MUX 182. The input data also feed an input of controller 270. Controller 270 may base its decision based on any number of criteria. For example, controller 270 may determine the run-length and/or DC balance estimation of the input data. Controller 270 may also consider or look at other factors, including without limitation the average transition density (which would affect power), how uniform the transition density is (which would affect power transients due to non-uniform power demand of the circuit), the location of specific transitions relative to transitions on nearby channels (which could affect crosstalk) or the position of transitions relative to the beginning of a parallel word, which can lead to systematic jitter conditions (deterministic jitter) as may occur at recurring times in a transceiver. Controller 270 may use the result(s) at least in part in determining which of the input signals of MUX 182 should be provided as the output signal of MUX 182. Techniques and circuits for determining various criteria, including run-length, and DC balance estimation are well known to persons of ordinary skill in the art.

Depending on select signal 180 (provided by controller 270), MUX 182 may provide the input data as the output data, i.e., without any encoding added or performed. This situation may arise, for example, when controller 270 determines that application of encoding scheme(s) by logic circuit 160 and/or bit ordering circuit 168 does not meet one or more criteria. Controller 270 may make the determination alone or in cooperation with other circuitry (not shown). The criteria may include, without limitation, a specified or desired run-length and/or DC balance estimation. Other criteria may also be used, as persons of ordinary skill in the art would understand.

The input data feed one input of logic circuit 160. Controller 270 provides input signal 162 (e.g., patterns for use in performing logic operation(s)) to logic circuit 160. Logic circuit 160 performs the encoding operation described above on the input data, using input signal 162. Under the control of controller 270, a variety of patterns or logic operations may be implemented by logic circuit 160. For example, in some embodiments, logic circuit 160 may perform an XOR operation between the data and a repeating "01" pattern (input signal 162) or other pattern, as described above.

The result of the logic operation(s), i.e., the output of logic circuit 160, feeds one input of MUX 182. Controller 270 also uses the output of logic circuit 160 to determine its run-length and/or DC balance estimation. Controller 270 may use the result(s) at least in part in determining which of the input signals of MUX 182 should be provided as the output signal of MUX 182.

Bit ordering circuit 168 receives the output of logic circuit 160. Bit ordering circuit 168 performs the encoding operation described above on the output of logic circuit 160. The result of the bit ordering operation, i.e., the output of bit ordering circuit 168, feeds an input of MUX 182. Controller 270 also uses the output of bit ordering circuit to determine its run-length and/or DC balance estimation. Controller 270 may use the result(s) at least in part in determining which of the input signals of MUX 182 should be provided as the output signal of MUX 182.

Controller 270 provides select signal 180 of MUX 182. Select signal 180 of MUX 182, i.e., signal 180, may include more than one bit, depending on the configuration (and inclusion) of logic circuit 160 and bit ordering circuit 168 or based on the inclusion of multiple logic circuits 160 and bit ordering circuits 168, as desired. In the exemplary embodiment shown, MUX 182 enables the selection of one of three sets of data, i.e., the original data, the data at the output of logic circuit 160, or the data at the output of bit ordering circuit 168. Such a circuit provides increased flexibility in selecting the data that best match one or more desired criteria, such as run-length size, DC balance value, etc.

Generally, controller 270 uses the results of determining run-length, and/or DC balance estimation of the input data, the output of logic circuit 160, and/or the output of bit ordering circuit 168. In this manner, controller 270 may use a variety of bit patterns, ordering patterns, and operations to optimize or improve the run-length and/or DC balance estimation of the input data by applying one or more encoding schemes. In exemplary embodiments, controller 270 may be implemented in a variety of ways, as persons of ordinary skill in the art would understand. For example, in some embodiments, controller 270 may include a finite-state machine (FSM). As another example, in some embodiments, controller 270 may include custom logic, a processor (e.g., microprocessor or microcontroller), etc.

As noted, the decision whether to apply one or more encoding scheme(s) and, if so, which encoding scheme(s), patterns, etc., to apply may be based on one or more criteria, as persons of ordinary skill in the art would understand. In some embodiments, such as those described above, the decision whether to apply one or more encoding schemes (or variations of the same scheme) may be based on one or more metrics, such as run-length, DC balance, etc. For example, different XOR patterns or different bit ordering may be used based on determined (or estimated or approximate) run-length, DC balance, etc.

In some embodiments, the decision whether to apply one or more encoding schemes (or variations of the same scheme, for example, different XOR patterns or different bit ordering) may be based on the use of one or more cost functions. This technique may be applied to the embodiments described above. The transmitter (or transceiver) may apply or use one or more cost functions that measure or determine the desirability or cost of using one or more encoding schemes (for example, one cost function per encoding scheme, one cost function for more than one encoding scheme, etc.).

Typically, the lower the cost or the value determined by using the cost function, the more desirable an encoding scheme or operation. Thus, the transmitter (or transceiver) may select one or more cost functions based on their values (say, for a given set of input signals) or the results the cost functions would produce. In this manner, a flexible mechanism may be developed and used for selecting encoding scheme(s) that meet one or more desired criteria.

Depending on the application, a particular or desired implementation, etc., a variety of cost functions may be used, as persons of ordinary skill in the art understand. The cost function may take into account a variety of factors, as persons of ordinary skill in the art understand. Such factors include hardware complexity, software or firmware complexity, processing overhead, delay, speed of processing, the gains (if any) and result(s) of applying the scheme(s) that include the cost function(s), quality of communication between transmitter and receiver (or between transceivers), etc.

Based on the result(s) of the cost function(s), one or more encoding schemes may be applied to the data before transmission to a receiver or transceiver. For example, in the embodiment shown in FIG. 14, controller 270 may use one or more cost functions to determine which encodings (if any) to use (e.g., via MUX 182), what pattern to use as input signal 162, what logic operation to use (in logic circuit 160), what bit ordering to use, etc.

The transmitter (or transceiver transmitting the data) may inform the receiving (or transceiver receiving the data) of the choice of encoding(s). The transmitter (or transceiver transmitting the data) may include one or more additional bits with the transmitted encoded data to indicate the choice of encoding(s) or variations of the same scheme, for example, different XOR patterns or different bit ordering, etc.

Note that the receiver (or receiving transceiver) need not be informed of the cost function or why the transmitter (or transmitting transceiver) used the encoding scheme(s). Note also that, in a bidirectional link, each side of the communication link may use a different cost function for its respective transmitter, as desired.

The additional bit(s) may be included with the data to be transmitted in a number of ways. For example, the additional bit(s) may precede the data or payload. FIG. 15 shows such a configuration according to an exemplary embodiment. Specifically, a set of bits 300 (e.g., a packet) may include one or more bits 302 that constitute the additional bit(s). Bits 302 may be a header, or part of a header, for example, a header in a data packet. The set of bits 300 also includes some bits that constitute the data or payload 304. Bit(s) 302, i.e., the additional bit(s) precede payload 304, i.e., bit(s) 302 are transmitted before payload 304.

As another example, the additional bit(s) may follow the data or payload. FIG. 16 shows such a configuration according to an exemplary embodiment. A set of bits 300 (e.g., a packet) may include one or more bits 302 that constitute the additional bit(s). The set of bits 300 also includes some bits that constitute the data or payload 304. Bit(s) 302, i.e., the additional bit(s) succeed or follow payload 304, i.e., bit(s) 302 are transmitted after payload 304. Put another way, bits 302 may trail the data payload in the set of bits 300, for example, a data packet. Note that a header may also be used, for example, as part of a data packet.

Referring to FIGS. 15-16, a variety of sizes and configurations of data or payloads may be accommodated. To do so, data or payload bits 304 may include a numbers of bits that corresponds to the number of bits in the data or payload. For example, in some embodiments, data bits 304 may include 32 bits, corresponding to a 32-bit payload. In other embodiments, data bits 304 may include 64 bits, corresponding to a 64-bit payload, etc.

Note that in some embodiments the transmitter (or transceiver) and the receiver (or transceiver) may re-negotiate or change, for example, periodically, the agreed-upon or selected type(s) of encoding. The change may occur once, multiple times, at one or more unscheduled points in time, periodically, or according to other schemes, as persons of ordinary skill in the art understand.

The above description of the data or packet structures assumes a serial communication channel or medium. In other words, the bits of information travel along one communication link, for example, via two conductors or coupling mechanisms (one ground, one signal) for a single-ended link or via three conductors or coupling mechanisms (one ground, one each for the differential signals) for a differential link, such as typically used with PAM systems. Other variations are possible, as persons of ordinary skill in the art would understand.

Techniques may be used to reduce information processing overhead, complexity, and/or cost, and/or increase throughput, or make trade-offs among those attributes. In some embodiments, a decision on whether to use any encoding scheme(s) or which encoding scheme(s)/pattern(s) to use relies on a calculation of run-length and/or DC balance. Calculation of run-length and/or DC balance entails providing and using some hardware or circuitry (or perform the calculations via firmware or software, where the performance is acceptable). Such embodiments trade off higher complexity and cost for increased encoding performance.

In other embodiments, rather than a calculation of run-length, an approximation of run-length may be used. Using an approximated run-length may be cheaper, and may reduce gate-count. As an example, the calculation of run-length may be performed on two or more sets of data bits within a data packet or payload.

Figure 17:
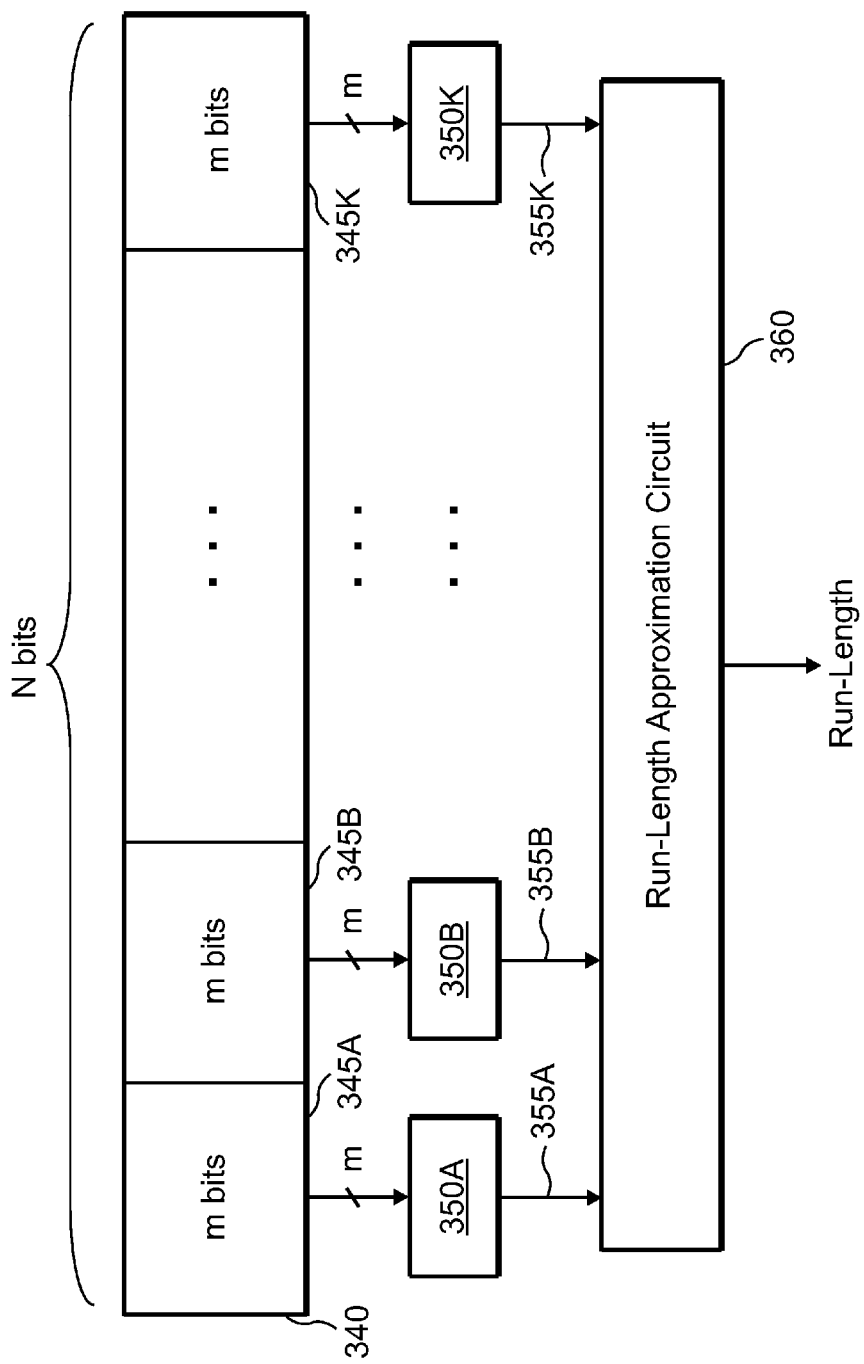
FIG. 17 depicts a block diagram of a circuit for approximating run-length according to exemplary embodiment.

Generally, an N-bit payload may be divided into k sets or subsets of m bits each (or a variable number of bits, if desired). Run-length may then be calculated using the k sets. FIG. 17 shows a block diagram of a circuit for approximating run-length according to this scheme. The circuit includes logic circuits 350A-350K. Logic circuits 350A-350K may reside in an encoder (e.g., encoder 114 in FIG. 1A, or encoder/decoder 146A/146B in FIG. 1B), or at other appropriate locations in a circuit or system, as desired.

Referring to FIG. 17, in the embodiment shown, a data packet or payload 340 includes a set of N data bits that are divided into sets 1 through k (labeled 345A-345K) of m bits. (Note that the example shown does not illustrate other bits, such as additional bits, described above.) Logic circuits 350A-350K operate on a respective set of m bits (labeled 345A-345K), and calculate respective outputs based on the sets. Outputs 355A-355K of logic circuits 350A-350K provide the respective outputs based on bit sets 345A-345K.

For each group of m bits, a respective one of logic circuits 350A-350K determines whether the respective group of bits is all logic zeros or all logic ones. In exemplary embodiments, logic circuits 350A-350K may include m-input AND gates and/or m-input OR gates. The m-input AND gates produce at logic one output if all m bits in a respective group of bits have logic one values. Conversely, the m-input OR gates produce at logic zero output if all m bits in a respective group of bits have logic zero values. By using this technique, the complexity and, hence, cost of the run-length calculations may be reduced. In other words, because each of run-length calculation circuits 350A-350K operates on m bits, rather than N bits (where N>m), this technique eases burden or calculation complexity of the run-length calculation.

As an example, consider the data bits shown in FIG. 18, corresponding to 7 (i.e., K=7) groups of 4 bits each (i.e., m=4), and the associated outputs of logic circuits 350A-350K. The "X" outputs denote situations where all m bits in a group of bits do not have the same logic value, whereas the "0" and "1" outputs denote, respectively, situations where all m bits in a group of bits have logic zero and logic one values. When looking at groups of four bits, groups 3-6 include all logic zeros, and therefore there is a run-length of four groups. Group 7 includes all logic ones, but is not included because its constant value of logic ones is different than the groups of logic zeros. Run-length approximation circuit 360 then estimates the run-length of the data bits by using the output of logic circuits 350A-350K. The combined run-length calculation now works on a dataset that is reduced in effective length by four. Note that from the outputs of logic circuits 350A-350K one may determine that the run-length in the data bits is at least 16. Given that the last two logic zero values in the second group of bits are not counted, no difference in this case between run-lengths of 16 and 18 would be determined. The worst-case error occurs when there is a run-length of (group_size−1), i.e., (m−1), in both end groups of bits. In that case, the maximum error would be 2×3, or 6, for the situation where m=1. This situation occurs, for example, if the pattern for logic zeros is 1000 0000 0001. Persons of ordinary skill in the art understand that the examples provided are merely illustrative, and other configurations may be used, such as other values of m, k, and N, and including situations where the k sets of data bits may include variable numbers of bits, rather than all include an equal number of bits, etc., as desired.

Note that the receiver (or receiving transceiver) performs decoding based on the encoding bit(s) (the additional bit(s) described above) or an agreed-upon or negotiated communication mechanism or protocol. Thus, the receiver (or receiving transceiver) need not know the decision criteria used by the transmitter (or transmitting transceiver), such as using exact or approximate run-lengths, etc., assuming that the overall communication link meets certain criteria (e.g., provides sufficient transitions, DC balance quality, etc.).

Consequently, different transmitters/transceivers, for example, as implemented in different ICs, may use different levels of accuracy in calculating the run-length in determining what (if any) encoding scheme(s) to use. In addition, different transmitters/transceivers may use different techniques or criteria for determining when to use a given encoding scheme, pattern, etc, which may provide additional flexibility.

Similarly, the transmitter/transceiver may change its threshold rules for balancing DC-balance versus run-length without that change resulting in any change in the receiver. The transmitter/transceiver may also choose to change these heuristics (selecting/changing encoding scheme(s)) based on what maximizes or improves the quality of the link (e.g., BER measures). Such tuning may be performed manually, or may be based on measures of link quality (e.g., real-time or periodic feedback on the quality of the communication link and the communication between transmitter and receiver or between transceivers).

As noted, in some embodiments, one or more bits may be used to indicate the existence and/or type of encoding scheme(s)/parameter(s) (e.g., patterns) used. Such additional bit(s) may be used to inform the receiver or receiving transceiver of decision(s) made by the transmitter or transmitting transceiver. The additional bit(s) may also be used to perform more than one function. Specifically, the bit(s) may be used to initiate or establish communication or word lock or synchronization between a transmitter (or transmitting transceiver) and a receiver (or receiving transceiver). Once communication or word lock or synchronization is established, the bit(s) may be used for other purposes. Such purposes include selection of one or more encoding scheme(s), pattern(s) used, etc., as described in detail in this document. In some embodiments, such bit(s) may be included in a data or packet header.

In some embodiments, this technique may be used to improve conventional communication techniques/protocols. For example, the 64/66 and 64/67 encoding protocols use the transition on the header to indicate word-boundaries. Thus, in the 64/66 protocol, header bits "01" indicate data, and "10" bit indicate control information ("00" and "11" are illegal states). In the 64/67 protocol, the header bits x01 indicate data, and x10 indicate control information ("x00" and "x11" are illegal states), where x can be either logic 0 or logic 1. Once word-lock is established between the communicating devices (e.g., transmitter/receiver or transceiver/transceiver), the header bits may be used for other purposes.

In some embodiments, the header bits may be used initially to establish or initiate communication (e.g., using 64/66 encoding) but, once communication has begun, the header bits may be used to communicate additional information about decisions made by the transmitter/transceiver, as described above (e.g., encoding scheme(s), pattern(s) used, etc.). Thus, the unused or illegal header bits/header bit states, for example, "00" and/or "11" may be used in some embodiments for dual purposes.

Note that the receiver (or receiving transceiver) need not know when the transition between the two uses of the header bit(s) may happen, but rather that it will happen sometime after word-lock occurs or communication has been successfully initiated. The transmitter refrains from using the alternative encodings that would use or require header bits 00 or 11 prior to word-lock being established. This establishment of word-lock could be based on a timer where the transmitter assumes the receiver will have achieved word-lock after a pre-determined number of words, or it could be done via direct communication, as desired. The transition between the two uses of header bit(s) may occur more than once. For example, suppose that the transmitter (or transmitting transceiver) is informed that the receiver (or receiving transceiver) failed to receive a sufficiently large number of packets or that receiver (or transmitting transceiver) word-lock was lost. The transmitter (or transmitting transceiver) may revert to using the header bits for establishing or initiating communication.

Once word lock has been established or communication initiated, the receiver (or receiving transceiver) may indicate to the transmitter (or transmitting transceiver) that it is receiving data. The transmitter (or transmitting transceiver) may then revert to using the header bits for communicating other information (e.g., encoding scheme(s), pattern(s) used, etc.) to the receiver (or receiving transceiver).

Figure 19:
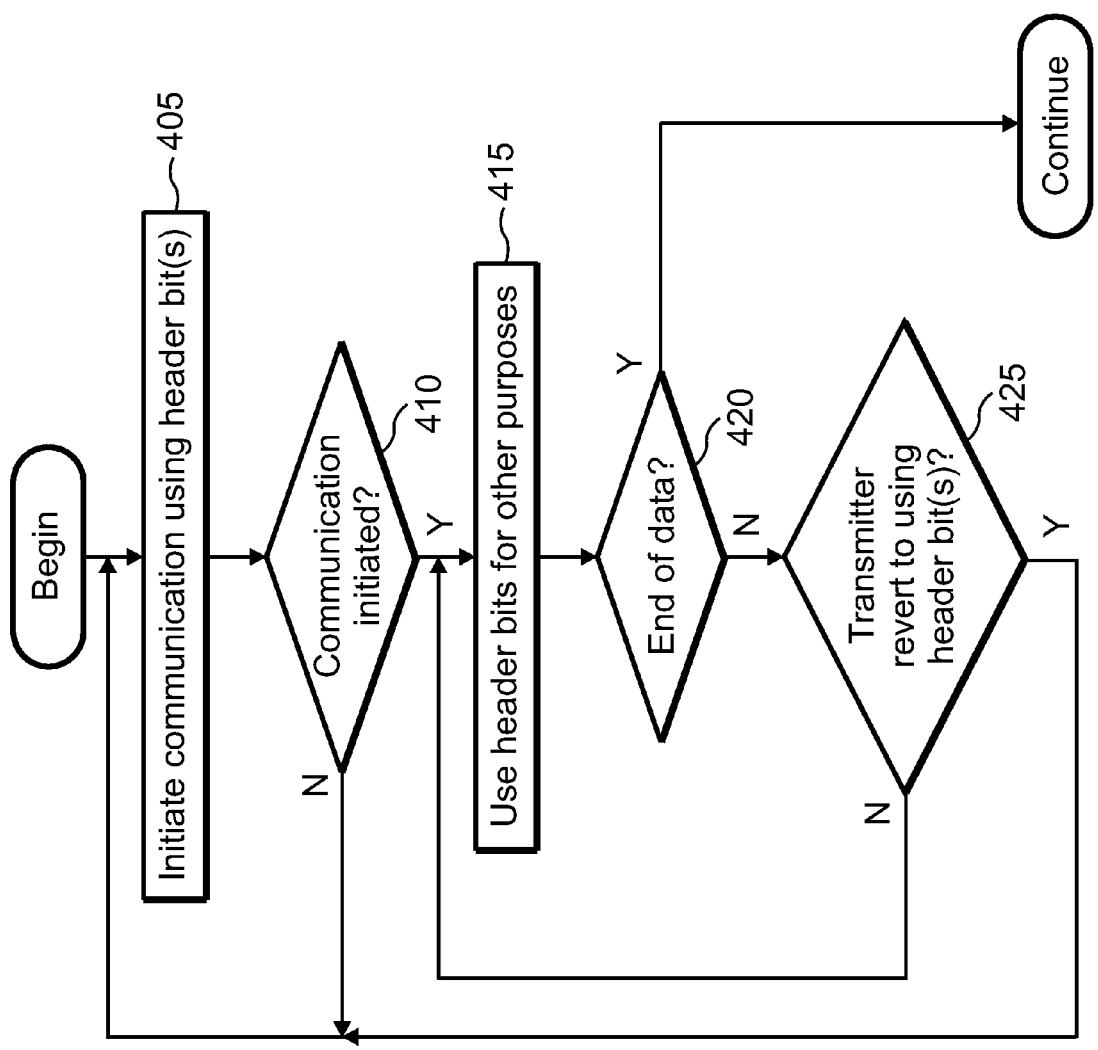
FIG. 19 shows a flow diagram of a technique for providing communication via a link according to an exemplary embodiment.

FIG. 19 shows a flow diagram of using headers according to an exemplary embodiment. The various operations shown in the flow diagram may be implemented in a variety of ways and using various communication protocols or encoding techniques, as persons of ordinary skill in the art would understand. At 405, an attempt is made to initiate communication, using the header bit(s), as described above. At 410, a check is made to determine whether the attempt to initiate communication succeeded. If not, another attempt is made by returning to 405. If communication has been initiated, at 415 the header bits are used for other purposes, as described above, for example, to communicate decision(s) on encoding scheme(s), pattern(s) used, etc.

At 420, a check is made to determine whether the data have ended (e.g., no more data exist to communicate), or communication should be terminated, for whatever reason. If so, communication ends. If not, at 425 a check is made to determine whether the transmitter should revert back to not choosing or using the alternative coding, for example, as indicated by 00 or 11, as described above, for example, because of loss of word lock or synchronization, lack of successful communication of all data, etc. (note that, after reverting back, the encoding will be as good as before the application of this technique). If so, at 410 the use of the header bit(s) is reverted.

As persons of ordinary skill in the art would understand, one may apply the disclosed concepts effectively to various types of encoding. For example, use the disclosed techniques to modify and improve traditional encoding techniques. Examples provided constitute merely illustrative applications, and are not intended to limit the application of the disclosed concepts to other situations or scenarios.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus, comprising:
an encoder circuit that encodes data bits for transmission as a data stream via a communication link using pulse amplitude modulation (PAM), the encoder circuit comprising:
 a bit order scrambling circuit that, based on a run-length of the data bits, generates encoded data bits having a DC imbalance smaller than a DC imbalance of the data bits by assigning a corresponding new bit location to each bit of the data bits and moving each bit of the data bits to the corresponding new bit location; and
 a logic circuit configured to perform a logic operation on a pattern of bits and the data bits based on the DC imbalance of the data bits to generate the encoded data bits having the DC imbalance that is smaller than the DC imbalance of the data bits, wherein the logic operation is performed based on the run-length of the data and based on a subset of transition types.

2. The apparatus according to claim 1, wherein the bit order scrambling circuit selectively assigns the corresponding new bit location to each bit of the data bits.

3. The apparatus according to claim 2, wherein the bit order scrambling circuit assigns the corresponding new bit location to each bit of the data bits based on one or more of: (a) a cost function and (b) a DC balance estimation of the apparatus.

4. The apparatus according to claim 1, wherein the bit order scrambling circuit assigns the corresponding new bit location to each bit of the data bits based on the run-length of the data based on a subset of transition types.

5. The apparatus according to claim 1, wherein the logic operation comprises an addition modulus depending on an order of the PAM used in the communication link.

6. The apparatus according to claim 1, wherein the logic operation is performed based on one or more of: (a) a cost function and (b) a DC balance estimation of the apparatus.

7. The apparatus according to claim 1, wherein respective outputs of the bit order scrambling circuit and the logic circuits are selectively used to generate the encoded data bits.

\* \* \* \* \*